United States Patent
Arita

(10) Patent No.: US 10,319,774 B2
(45) Date of Patent: Jun. 11, 2019

(54) IMAGE CAPTURING DEVICE

(71) Applicant: OLYMPUS CORPORATION, Tokyo (JP)

(72) Inventor: Mai Arita, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 81 days.

(21) Appl. No.: 15/085,474

(22) Filed: Mar. 30, 2016

(65) Prior Publication Data

US 2016/0211299 A1 Jul. 21, 2016

Related U.S. Application Data

(63) Continuation of application No. PCT/JP2014/074656, filed on Sep. 18, 2014.

(30) Foreign Application Priority Data

Oct. 1, 2013 (JP) .................. 2013-206211

(51) Int. Cl.
*H04N 5/369* (2011.01)
*H04N 5/374* (2011.01)
*H04N 5/376* (2011.01)
*H01L 27/146* (2006.01)

(52) U.S. Cl.
CPC .. *H01L 27/14636* (2013.01); *H01L 27/14634* (2013.01); *H04N 5/369* (2013.01);
(Continued)

(58) Field of Classification Search
CPC ...... H04N 5/3532; H04N 5/376; H04N 5/357; H04N 5/3745; H04N 5/3658
See application file for complete search history.

(56) References Cited

U.S. PATENT DOCUMENTS 8,946,798 B2 * 2/2015 Horiike ............ H01L 27/14623
257/294
2006/0001918 A1 * 1/2006 Okano ................ H04N 5/3653
358/482
(Continued)

FOREIGN PATENT DOCUMENTS

JP 2009-38781 A 2/2009
JP 2010-225927 A 10/2010
(Continued)

OTHER PUBLICATIONS

International Search Report dated Dec. 2, 2014, issued in Counterpart International Application No. PCT/JP2014/074656 (2 pages).
(Continued)

*Primary Examiner* — Roberto Velez
*Assistant Examiner* — Tuan H Le
(74) *Attorney, Agent, or Firm* — Westerman, Hattori, Daniels & Adrian, LLP

(57) ABSTRACT

An image capturing device includes: a first substrate; a second substrate arranged so that the second substrate overlaps the first substrate; a pixel unit having a plurality of pixels arranged in a matrix shape on the first substrate; a first vertical scanning circuit arranged on one of the first substrate and the second substrate and configured to output a control signal supplied to every row or every two or more rows of the plurality of pixels; and a plurality of first buffers arranged on the second substrate so that the plurality of first buffers overlap the pixel unit, provided in correspondence with one row or a plurality of rows of the plurality of pixels, and connected to respective signal lines through which the control signal output from the first vertical scanning circuit is transmitted.

7 Claims, 14 Drawing Sheets

(52) U.S. Cl.
CPC ............. *H04N 5/374* (2013.01); *H04N 5/379* (2018.08); *H04N 5/3742* (2013.01); *H04N 5/3765* (2013.01); *H01L 27/14643* (2013.01)

(56) References Cited

U.S. PATENT DOCUMENTS

| | | | |
|---|---|---|---|
| 2009/0244344 A1* | 10/2009 | Takayanagi | H04N 3/1512 348/308 |
| 2012/0274823 A1* | 11/2012 | Matsuda | H04N 5/3532 348/302 |
| 2012/0293698 A1 | 11/2012 | Sukegawa et al. | |
| 2013/0215290 A1* | 8/2013 | Solhusvik | H04N 5/2355 348/231.99 |
| 2013/0222660 A1* | 8/2013 | Senda | H01L 27/14641 348/302 |
| 2014/0168491 A1 | 6/2014 | Totsuka | |
| 2014/0284453 A1* | 9/2014 | Shimizu | H04N 5/3698 250/208.1 |

FOREIGN PATENT DOCUMENTS

| | | |
|---|---|---|
| JP | 2011-159958 A | 8/2011 |
| JP | 2013-090127 A | 5/2013 |
| JP | 2014-120858 A | 6/2014 |

OTHER PUBLICATIONS

Office Action dated Jan. 4, 2017, issued in counterpart Japanese Patent Application No. 2013-206211, with English translation. (6 pages).

\* cited by examiner

IMAGE CAPTURING DEVICE

This application is a continuation application of PCT Patent Application No. PCT/JP2014/074656, filed Sep. 18, 2014, whose priority is claimed on Japanese Patent Application No. 2013-206211, filed Oct. 1, 2013. The contents of the Japanese Patent Application and the PCT Application are incorporated herein by reference.

BACKGROUND OF THE INVENTION

Field of the Invention

The present invention relates to an image capturing device.

Description of Related Art

In recent years, video cameras, digital still cameras, etc. have been generally widespread. A solid-state image capturing device is used for such cameras. In the solid-state image capturing device, an image capturing area in which a plurality of pixels are arranged in a matrix shape is provided on a semiconductor substrate having an image capturing element. The solid-state image capturing device is of a charge coupled device (CCD) type, a complementary metal oxide semiconductor (CMOS) type, or the like.

In a general CMOS type solid-state image capturing device, a photoelectric conversion element is provided in each of a plurality of pixels. The CMOS type solid-state image capturing device converts exposure light to signal charge through a photoelectric conversion element in a pixel and reads the generated signal charge from the photoelectric conversion element in every row.

In the conventional CMOS type solid-state image capturing device, a control signal is supplied from a vertical scanning circuit, for example, arranged on the left side of an image capturing area, to the pixel of every row (for example, see Japanese Unexamined Patent Application, First Publication No. 2009-38781). When the number of pixels is small, the control signal is substantially simultaneously supplied from the vertical scanning circuit to a plurality of pixels of the same row, and signal charge generated by photoelectric conversion elements of the plurality of pixels of the same row can be simultaneously read from the photoelectric conversion elements.

SUMMARY OF THE INVENTION

According to a first aspect of the present invention, an image capturing device includes: a first substrate; a second substrate arranged so that the second substrate overlaps the first substrate; a pixel unit having a plurality of pixels arranged in a matrix shape on the first substrate; a first vertical scanning circuit arranged on one of the first substrate and the second substrate and configured to output a control signal supplied to every row or every two or more rows of the plurality of pixels; and a plurality of first buffers arranged on the second substrate so that the plurality of first buffers overlap the pixel unit, provided in correspondence with one row or a plurality of rows of the plurality of pixels, and connected to respective signal lines through which the control signal output from the first vertical scanning circuit is transmitted.

According to a second aspect of the present invention, the image capturing device according to the first aspect of the present invention may further include: a plurality of second buffers arranged on the second substrate, provided in correspondence with one row or a plurality of rows of the plurality of pixels, and connected to the signal lines to which the first buffers are connected.

According to a third aspect of the present invention, in the image capturing device according to the second aspect of the present invention, the plurality of second buffers may be arranged so that the plurality of second buffers overlap the pixel unit.

According to a fourth aspect of the present invention, the image capturing device according to any one of the first to third aspects of the present invention may further include: a second vertical scanning circuit arranged on one of the first substrate and the second substrate and configured to output the control signal supplied to every row or every two or more rows of the plurality of pixels in synchronization with the first vertical scanning circuit. The plurality of pixels may include a first pixel and a second pixel arranged in the same row. The control signal output from the first vertical scanning circuit may be supplied to the first pixel. The control signal output from the second vertical scanning circuit may be supplied to the second pixel.

According to a fifth aspect of the present invention, in the image capturing device according to the first aspect of the present invention, the first vertical scanning circuit may be arranged so that the first vertical scanning circuit at least partially overlaps the pixel unit.

According to a sixth aspect of the present invention, in the image capturing device according to the first aspect of the present invention, two first buffers arranged in two rows adjacent to each other among the plurality of first buffers may be arranged so that the two first buffers are displaced from each other in a row direction.

According to a seventh aspect of the present invention, an image capturing device includes: a first substrate; a second substrate; a third substrate; a pixel unit having a plurality of pixels arranged in a matrix shape on the first substrate; a first vertical scanning circuit arranged on the third substrate and configured to output a control signal supplied to every row or every two or more rows of the plurality of pixels; and a plurality of first buffers arranged on the second substrate so that the plurality of first buffers overlap the pixel unit, provided in correspondence with one row or a plurality of rows of the plurality of pixels, and connected to respective signal lines through which the control signal output from the first vertical scanning circuit is transmitted. The first substrate and the second substrate overlap each other and the third substrate overlaps a surface opposite to a surface of the second substrate facing the first substrate, or the first substrate and the third substrate overlap each other and the second substrate overlaps a surface opposite to a surface of the third substrate facing the first substrate.

DETAILED DESCRIPTION OF THE INVENTION

Hereinafter, embodiments of the present invention will be described with the drawings.

(First Embodiment)

Figure 1:
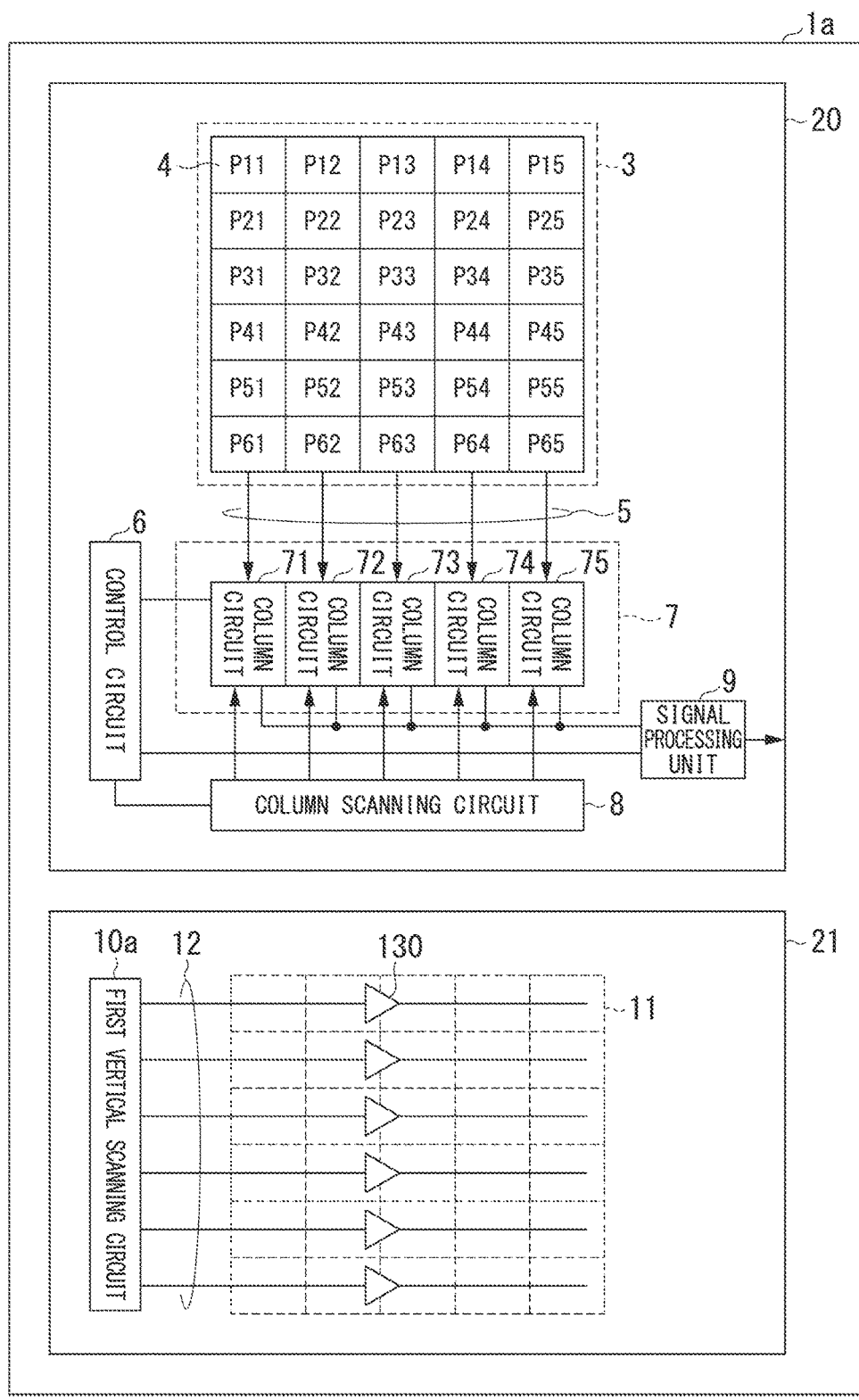
FIG. 1 is a block diagram showing a configuration of an image capturing device according to a first embodiment of the present invention.

First, the first embodiment of the present invention will be described. FIG. 1 shows a configuration of an image capturing device 1a according to this embodiment. The image capturing device 1a has two substrates which are a first substrate 20 and a second substrate 21. Although the first substrate 20 and the second substrate 21 are shown as being arranged next to each other in FIG. 1, the first substrate 20 and the second substrate 21 are actually arranged so that they overlap each other. In other words, each of the first substrate 20 and the second substrate 21 has two surfaces, and the first substrate 20 and the second substrate 21 are arranged so that a first surface of the first substrate 20 and a first surface of the second substrate 21 face each other. Also, the first substrate 20 and the second substrate 21 are electrically connected to each other.

The first substrate 20 has a pixel unit 3, a plurality of vertical signal lines 5, a control circuit 6, a column circuit unit 7, a column scanning circuit 8, and a signal processing unit 9. The pixel unit 3 has a plurality of pixels 4 arranged in a matrix shape on the first substrate 20. In FIG. 1, the pixels 4 are denoted by reference signs P11 to P65 and arranged in six rows and five columns. In general, the pixel 4 has a photoelectric conversion element (for example, a photodiode) and a transistor. The pixel 4 outputs a pixel signal corresponding to an amount of incident light in accordance with a control signal output from a first vertical scanning circuit 10a of the second substrate 21. Although 30 pixels 4 in six rows and five columns are arranged in the pixel unit 3 in FIG. 1, it is only necessary for the number of rows and the number of columns to be two or more in the arrangement of the pixels 4.

A plurality of vertical signal lines 5 extending in a column direction (vertical direction) are arranged in correspondence with each column of the plurality of pixels 4. The pixels 4 of each column are connected to the vertical signal line 5 corresponding to each column. The column circuit unit 7 is constituted of column circuits 71 to 75 corresponding to columns of the plurality of pixels 4. The pixel signal output from the pixel 4 is input to each column circuit via the vertical signal line 5. Each column circuit performs a process such as analog-to-digital (AD) conversion on the pixel signal.

The column scanning circuit 8 selects columns from which pixel signals are read and sequentially selects column circuits corresponding to the selected columns from column circuits 71 to 75. The column scanning circuit 8 reads pixel signals by causing the pixel signals to be sequentially output from the selected column circuits. The column scanning circuit 8 is constituted of a shift register, and so on. The signal processing unit 9 performs a process such as binarization on the pixel signals sequentially output from the column circuits 71 to 75 and outputs the processed signals. The control circuit 6 controls the column circuit unit 7, the column scanning circuit 8, and the first vertical scanning circuit 10a arranged on the second substrate 21. The arrangement position of each circuit block shown in the drawings does not necessarily match the actual arrangement position.

The second substrate 21 has the first vertical scanning circuit 10a, an area 11 immediately below the pixels, a plurality of pixel control signal lines 12, and a plurality of first buffers 130. The first vertical scanning circuit 10a outputs a control signal supplied to each row of the plurality of pixels 4. This control signal is a signal for controlling the pixel 4, and includes a signal for reading signal charge from the photoelectric conversion element of the pixel 4 and a signal for reading a pixel signal based on signal charge read from the photoelectric conversion element to the vertical signal line 5. The control signal supplied to the pixel 4 is common to every row.

The plurality of pixel control signal lines 12 extending in the row direction (horizontal direction) are arranged in correspondence with each row of the plurality of pixels 4. The pixel control signal lines 12 are connected to the first vertical scanning circuit 10a. The first vertical scanning circuit 10a outputs the control signal, which controls the plurality of pixels 4 and is supplied to every row or every two or more rows of the plurality of pixels 4, to the pixel control signal lines 12. The pixel control signal lines 12 are electrically connected to the first substrate 20. The control signal output to the pixel control signal line 12 is transmitted through the pixel control signal line 12 and further transferred to the first substrate 20. The control signal transmitted through the pixel control signal line 12 and transferred to the first substrate 20 is transferred to the pixel 4 of the row corresponding to the pixel control signal line 12. Accordingly, the pixel control signal line 12 constitutes a path through which the control signal output from the first vertical scanning circuit 10a is transmitted to one row of the plurality of pixels 4.

In the second substrate 21, the area 11 immediately below the pixels is arranged at a position corresponding to the pixel unit 3 of the first substrate 20. Accordingly, the area 11 immediately below the pixels is arranged so that the area 11 immediately below the pixels overlaps the pixel unit 3. The area 11 immediately below the pixels has the plurality of pixel control signal lines 12 and the plurality of first buffers 130. One first buffer 130 is arranged for one pixel control signal line 12. Accordingly, each first buffer 130 is provided in correspondence with one row of the plurality of pixels 4, and the first buffer 130 is arranged at a position overlapping the pixel unit 3. The first buffers 130 are arranged at points along the pixel control signal lines 12 and connected to the pixel control signal lines 12.

The control signal output from the first vertical scanning circuit 10a is transmitted through the pixel control signal line 12 and input to the first buffer 130. The control signal output from the first buffer 130 is transmitted through the pixel control signal line 12. Accordingly, the control signal via the first buffer 130 is supplied to some of the plurality of pixels 4 (three columns of the pixels 4 denoted by reference signs P13 to P63, P14 to P64, and P15 to P65 in FIG. 1).

Figure 2:
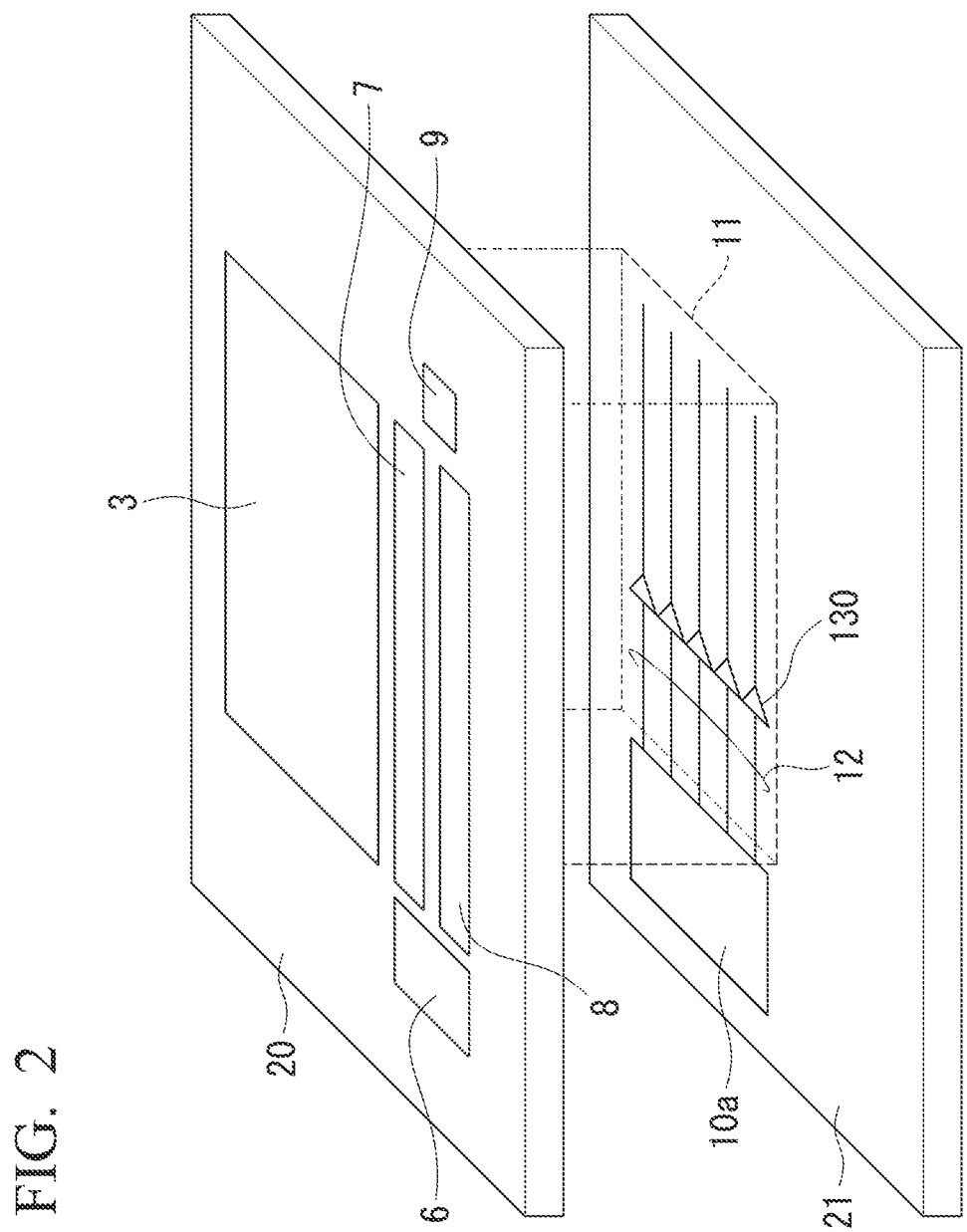
FIG. 2 is a perspective view of the image capturing device according to the first embodiment of the present invention.

FIG. 2 shows a relation between a position of the pixel unit 3 of the first substrate 20 and a position of the area 11 immediately below the pixels in the second substrate 21. FIG. 2 shows a state in which the image capturing device 1a is obliquely viewed. Also, FIG. 2 shows a state in which the first substrate 20 and the second substrate 21 are separated in a perpendicular direction. The first substrate 20 and the second substrate 21 are configured so that the pixel unit 3 and the area 11 immediately below the pixels overlap each other in the perpendicular direction.

Figure 3:
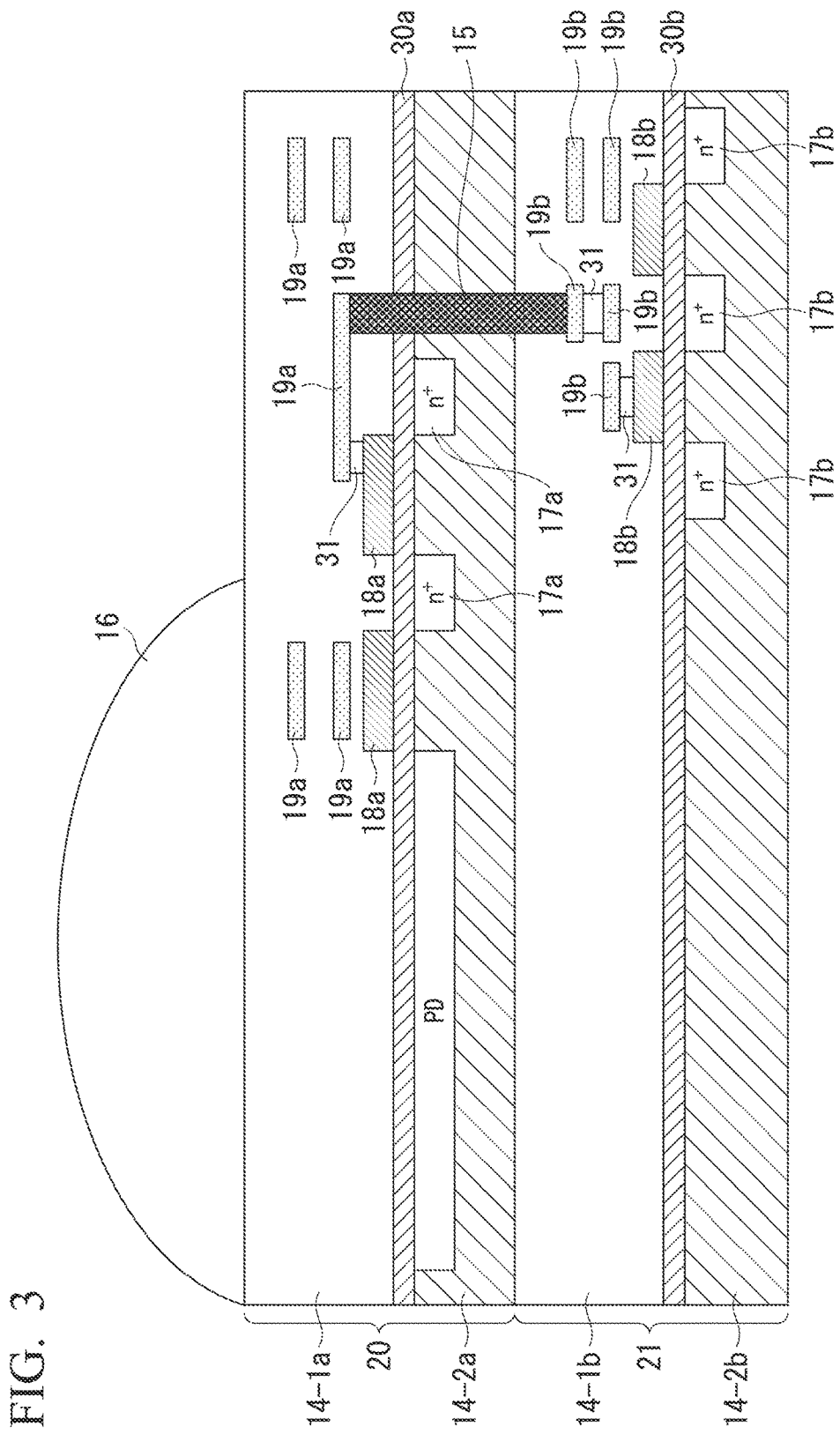
FIG. 3 is a cross-sectional view of the image capturing device according to the first embodiment of the present invention.

FIG. 3 shows cross-sectional structures of the first substrate 20 and the second substrate 21 in one pixel 4 of the image capturing device 1a. As shown in FIG. 3, when viewed from a side on which light is incident, a micro-lens 16, a first wiring layer 14-1a, an insulation film 30a, a first diffusion layer 14-2a, a second wiring layer 14-1b, an insulation film 30b, and a second diffusion layer 14-2b are three-dimensionally stacked in the perpendicular direction. The first substrate 20 has the first wiring layer 14-1a, the insulation film 30a, and the first diffusion layer 14-2a. The second substrate 21 has the second wiring layer 14-1b, the insulation film 30b, and the second diffusion layer 14-2b.

The first diffusion layer 14-2a is constituted of a semiconductor substrate, for example, a p-type semiconductor substrate. In the first diffusion layer 14-2a, a photoelectric conversion element (photodiode: PD) constituting the pixel 4 and a source-drain region 17a of a transistor are formed. In FIG. 3, only some of transistors constituting the pixel 4 are shown and other transistors are omitted.

The first wiring layer 14-1a has a gate electrode 18a of the transistor and wirings 19a of a plurality of layers formed on an upper side of the gate electrode 18a. The gate electrode 18a and the wiring 19a are connected to each other via a contact 31. Likewise, wirings 19a of different layers are connected to each other via a contact 31. The micro-lens 16 is formed on a surface of the first wiring layer 14-1a.

Similar to the first diffusion layer 14-2a, the second diffusion layer 14-2b is constituted of a semiconductor substrate. In the second diffusion layer 14-2b, the source-drain region 17b of the transistor constituting the first buffer 130 in FIGS. 1 and 2 is formed. FIG. 3 shows cross-sectional structures of the first substrate 20 and the second substrate 21 at a position at which the first buffer 130 is arranged. In the second substrate 21, there is no source-drain region 17b in the second diffusion layer 14-2b of a position which is immediately below the pixels 4 and at which no first buffer 130 is arranged.

The second wiring layer 14-1b has a gate electrode 18b of the transistor constituting the first buffer 130 and wirings 19b of a plurality of layers formed on an upper side of the gate electrode 18b. The gate electrode 18b and the wiring 19b are connected to each other via a contact 31. Likewise, wirings 19b of different layers are connected to each other via a contact 31. In the second substrate 21, there is no gate electrode 18b in the second wiring layer 14-1b of a position which is immediately below the pixels 4 and at which no first buffer 130 is arranged. The wirings 19b include the pixel control signal line 12 shown in FIGS. 1 and 2, a wiring connected between transistors, and wirings of a power supply and ground.

A through-electrode 15 is provided in the first wiring layer 14-1a, the insulation film 30a, and the first diffusion layer 14-2a of the first substrate 20 and the second wiring layer 14-1b of the second substrate 21. The through-electrode 15 passes through the first diffusion layer 14-2a and the insulation film 30a and connects the wiring 19b of the second wiring layer 14-1b and the wiring 19a of the wiring layer 14-1a.

The control signal transmitted through the pixel control signal line 12 in FIGS. 1 and 2 is transferred to the first wiring layer 14-1a via the through-electrode 15 and transmitted to the gate electrode 18a. ON and OFF of the transistor constituted of the gate electrode 18a and the source-drain region 17a are controlled by the control signal transmitted to the gate electrode 18a. The wirings 19a and 19b, the contact 31, and the through-electrode 15 shown in FIG. 3 constitute a path through which the control signal output from the first vertical scanning circuit 10a is transmitted to the plurality of pixels 4.

Figure 4:
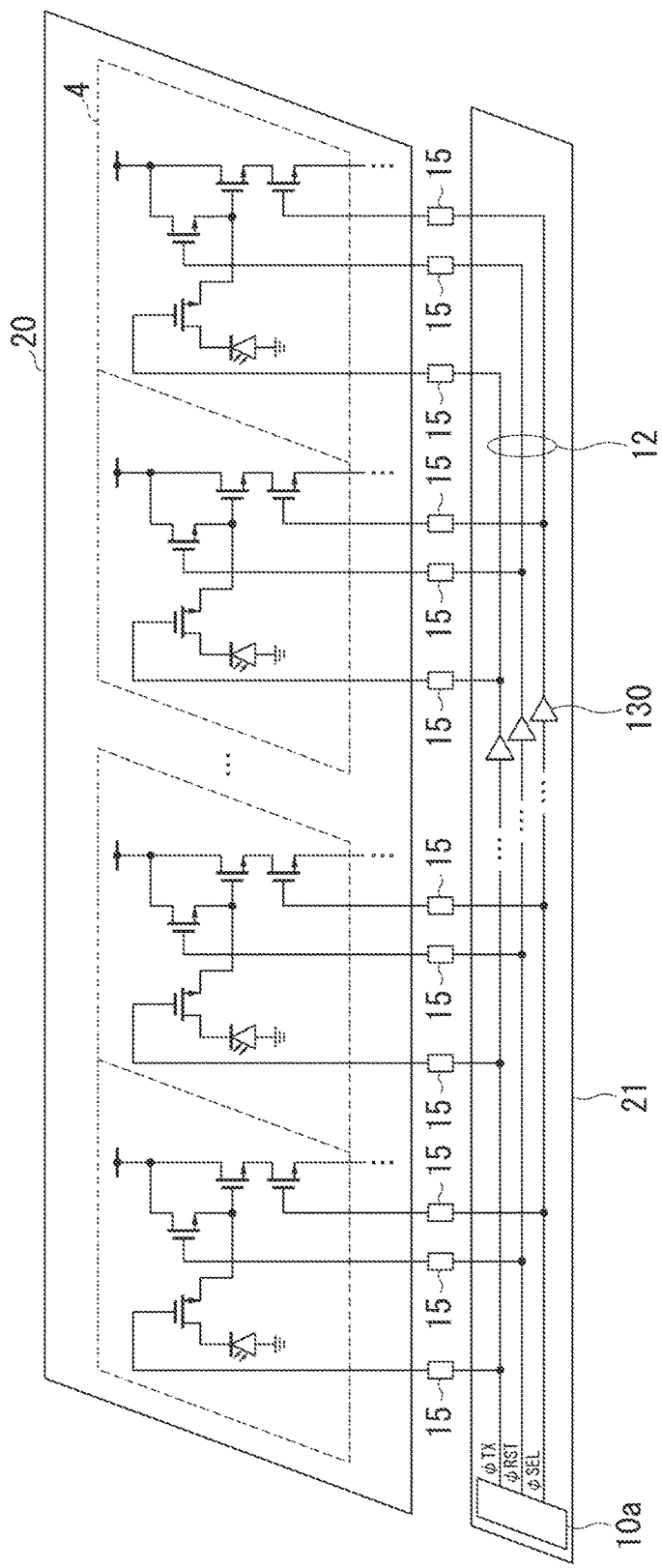
FIG. 4 is a schematic diagram showing connections related to control signals in the image capturing device according to the first embodiment of the present invention.

FIG. 4 shows an example of connections related to control signals supplied to the pixels 4. FIG. 4 shows the connections related to the control signals supplied to the pixels 4 for one row. In the first vertical scanning circuit 10a of the second substrate 21, three types of signals which are a transfer signal ϕTX, a reset signal ϕRST, and a select signal ϕSEL are generated as the control signals. Details of the control signals will be described with reference to FIG. 5.

For each of the above-described three types of signals, a signal line is arranged in the row direction of the pixels 4. One pixel control signal line 12 shown in FIGS. 1 and 2 includes the signal line corresponding to each of the above-described three types of signals. Also, the first buffer 130 is arranged for each of the above-described three types of signals. One first buffer 130 shown in FIGS. 1 and 2 includes the first buffer 130 corresponding to each of the above-described three types of signals. The three types of signals are generated for every row, transmitted on the second substrate 21 via the signal line corresponding to each of the three types of signals, and transferred to the transistor constituting the pixel 4 via the through-electrode 15. Because the control signals supplied to the pixels 4 of one row are three types of the transfer signal φTX, the reset signal φRST, and the select signal φSEL, three through-electrodes 15 are in each pixel when the control signals are supplied to each pixel 4.

Figure 5:
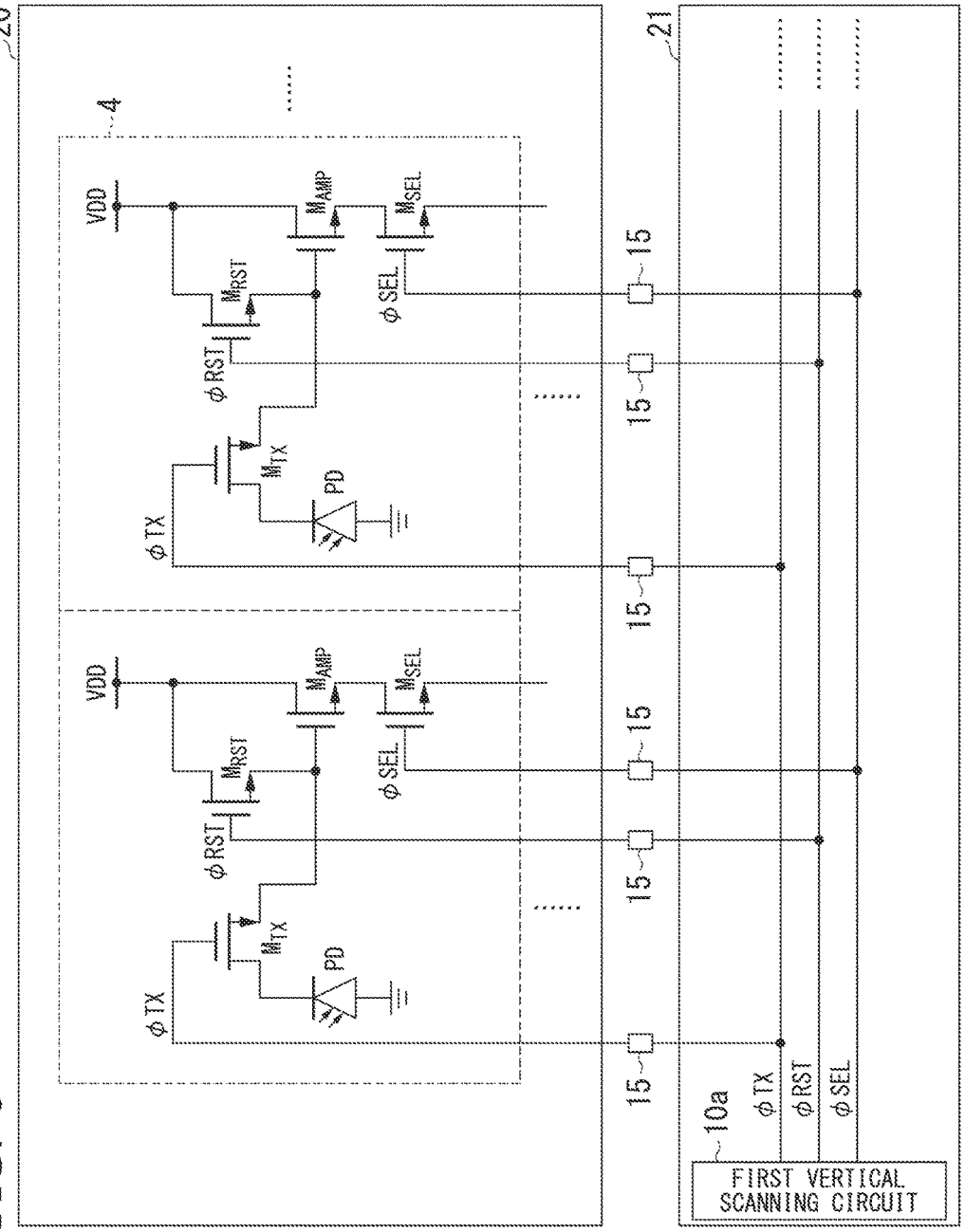
FIG. 5 is a schematic diagram showing a configuration of a pixel and connections related to the control signals in the image capturing device according to the first embodiment of the present invention.

FIG. 5 shows examples of a configuration of the pixels 4 and connections related to the control signals supplied to the pixel 4. FIG. 5 shows two enlarged pixels 4 of FIG. 4. The pixel 4 has a photoelectric conversion element PD, a transfer transistor $M_{TX}$, a reset transistor $M_{RST}$, an amplification transistor $M_{AMP}$, and a select transistor $M_{SEL}$.

The transfer signal φTX is supplied to gates of the transfer transistors $M_{TX}$. The photoelectric conversion elements PD are connected to drains of the transfer transistors $M_{TX}$, and sources of the transfer transistors $M_{TX}$ are connected to gates of the amplification transistors $M_{AMP}$. When the transfer signal φTX is a high level, the transfer transistors $M_{TX}$ transfer signal charge generated by the photoelectric conversion elements PD to the gates of the amplification transistors $M_{AMP}$.

Drains of the reset transistors $M_{RST}$ are connected to power-supply voltages VDD, and sources of the reset transistors $M_{RST}$ are connected to the sources of the transfer transistors $M_{TX}$. The reset signal φRST is supplied to the gates of the reset transistors $M_{RST}$. When the reset signal φRST is a high level, the reset transistors $M_{RST}$ reset the outputs of the pixels 4.

Drains of the amplification transistors $M_{AMP}$ are connected to the power-supply voltages VDD. The amplification transistors $M_{AMP}$ output signals obtained by amplifying signals, which are based on the signal charge transferred from the photoelectric conversion elements and input to the gates, from the sources.

Drains of the select transistors $M_{SEL}$ are connected to the sources of the amplification transistors $M_{AMP}$. The select signal φSEL is supplied to gates of the select transistors $M_{SEL}$. When the select signal φSEL is a high level, the select transistors $M_{SEL}$ output the signals output from the amplification transistors $M_{AMP}$ as pixel signals to the vertical signal line 5.

Figure 6:
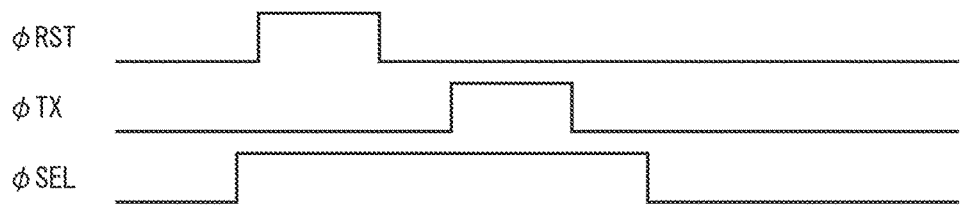
FIG. 6 is a timing chart of the control signals in the image capturing device according to the first embodiment of the present invention.

FIG. 6 shows waveforms of the reset signal φRST, the transfer signal φTX, and the select signal φSEL. The horizontal direction of FIG. 6 represents time and the vertical direction of FIG. 6 represents voltage. First, the select signal φSEL is a high level, and the select transistors $M_{SEL}$ are turned on. Thereby, the pixels 4 of any row are selected.

Subsequently, the reset signal φRST is a high level, and the reset transistors $M_{RST}$ are turned on. Thereby, voltages of the gates of the amplification transistors $M_{AMP}$ become the power-supply voltages VDD, and the outputs of the pixels 4 are reset. Thereafter, the reset signal φRST is a low level, and the reset transistors $M_{RST}$ are turned off.

Subsequently, the transfer signal φTX is a high level, and the transfer transistors $M_{TX}$ are turned on. Thereby, the signal charge generated by the photoelectric conversion elements PD is transferred from the photoelectric conversion elements PD to the gates of the amplification transistors $M_{AMP}$ and converted into voltages. Because the select transistors $M_{SEL}$ are turned on, voltage signals output from the sources of the amplification transistors $M_{AMP}$ are output from the sources of the select transistors $M_{SEL}$ as the pixel signals.

Subsequently, the transfer signal φTX is a low level, and the transfer transistors $M_{TX}$ are turned off. Thereafter, the select signal φSEL is a low level, and the select transistors $M_{SEL}$ are turned off. The timing shown in FIG. 6 is an example, and driving of the pixels 4 is not necessarily performed at the timing shown in FIG. 6.

Figure 7A:
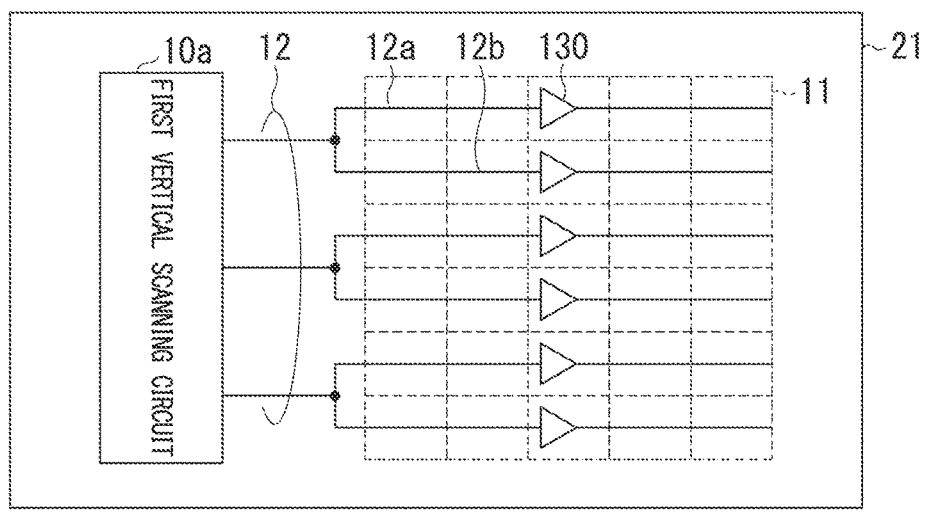
FIG. 7A is a block diagram showing a configuration of a second substrate of the image capturing device according to the first embodiment of the present invention.
Figure 7B:
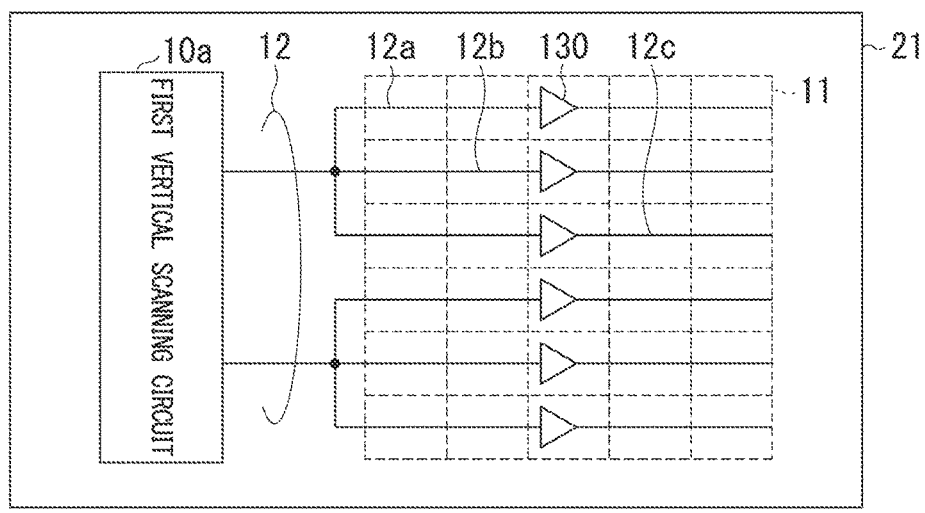
FIG. 7B is a block diagram showing a configuration of the second substrate of the image capturing device according to the first embodiment of the present invention.

Next, a modified example of this embodiment will be described. Although one pixel control signal line 12 is arranged for every row of the plurality of pixels 4 in FIGS. 1 and 2, the present invention is not limited thereto. For example, one pixel control signal line 12 may be arranged for every two or more rows of the plurality of pixels 4. FIGS. 7A and 7B show examples in which one pixel control signal line 12 is arranged for every two or more rows of the plurality of pixels 4. FIGS. 7A and 7B show the wiring of the pixel control signal lines 12 in the second substrate 21.

In FIG. 7A, one pixel control signal line 12 is arranged every two rows of the plurality of pixels 4. The pixel control signal line 12 corresponding to two rows of the plurality of pixels 4 branches along the way into pixel control signal lines 12a and 12b, each of which is arranged for every row of the plurality of pixels 4 and passes through the area 11 immediately below the pixels. The first buffers 130 are arranged at points along the pixel control signal lines 12a and 12b. A control signal for the two rows output from the first vertical scanning circuit 10a is transmitted to the pixel control signal line 12, divided along the way for the pixel control signal lines 12a and 12b, and transmitted to the pixel control signal lines 12a and 12b. Accordingly, the pixel control signal line 12 and the pixel control signal lines 12a and 12b shown in FIG. 7A constitute a path through which the control signal output from the first vertical scanning circuit 10a is transmitted to two rows of the plurality of pixels 4.

In FIG. 7B, one pixel control signal line 12 is arranged every three rows of the plurality of pixels 4. The pixel control signal line 12 corresponding to three rows of the plurality of pixels 4 branches along the way into pixel control signal lines 12a, 12b, and 12c, each of which is arranged for every row of the plurality of pixels 4 and passes through the area 11 immediately below the pixels. The first buffers 130 are arranged at points along the pixel control signal lines 12a, 12b, and 12c. A control signal for the three rows output from the first vertical scanning circuit 10a is transmitted to the pixel control signal line 12, divided along the way for the pixel control signal lines 12a, 12b, and 12c, and transmitted to the pixel control signal lines 12a, 12b, and 12c. Accordingly, the pixel control signal line 12 and the pixel control signal lines 12a, 12b, and 12c shown in FIG. 7B constitute a path through which the control signal output from the first vertical scanning circuit 10a is transmitted to three rows of the plurality of pixels 4.

The present invention is not limited to the above-described example, and one pixel control signal line 12 may be arranged for every four or more rows. Also, one pixel control signal line 12 arranged for every m rows of the plurality of pixels 4 and one pixel control signal line 12 arranged for every n rows of the plurality of pixels 4 (m≥1, n ≥1, and m≠n) may be mixed.

When one pixel control signal line 12 is arranged for every two or more rows of the plurality of pixels 4, pixel signals for a plurality of rows are simultaneously read. When one vertical signal line 5 is arranged for every column of the plurality of pixels 4 as shown in FIG. 1, pixel signals for a plurality of rows are read to the same vertical signal line 5 and added together. Thereby, it is possible to obtain an image with a high signal to noise (S/N) ratio at low resolution.

Although one vertical signal line 5 is arranged for every column of the plurality of pixels 4 in FIG. 1, a plurality of vertical signal lines 5 may be arranged for every column of the plurality of pixels 4 when one pixel control signal line 12 is arranged for every two or more rows of the plurality of pixels 4. For example, when one pixel control signal line 12 is arranged for every two rows of the plurality of pixels 4 as shown in FIG. 7A, two vertical signal lines 5 may be arranged for every column of the plurality of pixels 4. For example, pixels 4 of an odd row are connected to a first vertical signal line arranged for every column of the plurality of pixels 4, and pixels 4 of an even row are connected to a second vertical signal line arranged for every column of the plurality of pixels 4. In this example, control signals transmitted to the same pixel control signal line 12 are supplied to pixels 4 for two rows, and pixel signals for the two rows are simultaneously read. The pixel signal of the odd row among the simultaneously read pixel signals is output to the first vertical signal line, and the pixel signal of the even row among the simultaneously read pixel signals is output to the second vertical signal line. Thereby, it is possible to simultaneously read pixel signals for a plurality of rows and shorten a read time.

Figure 8A:
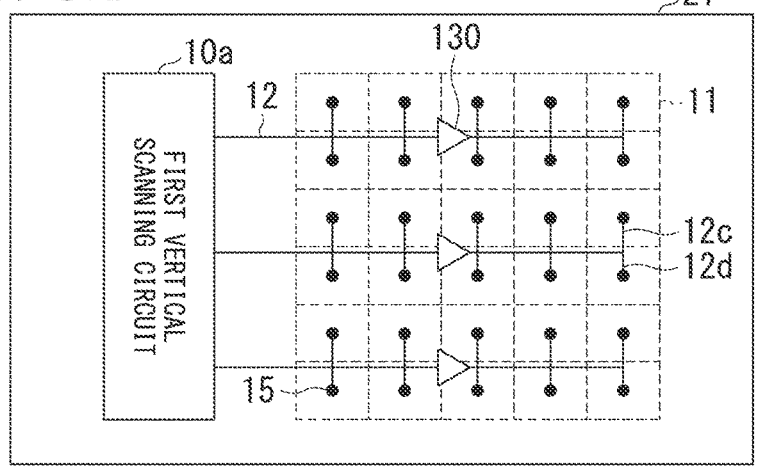
FIG. 8A is a block diagram showing a configuration of the second substrate of the image capturing device according to the first embodiment of the present invention.
Figure 8B:
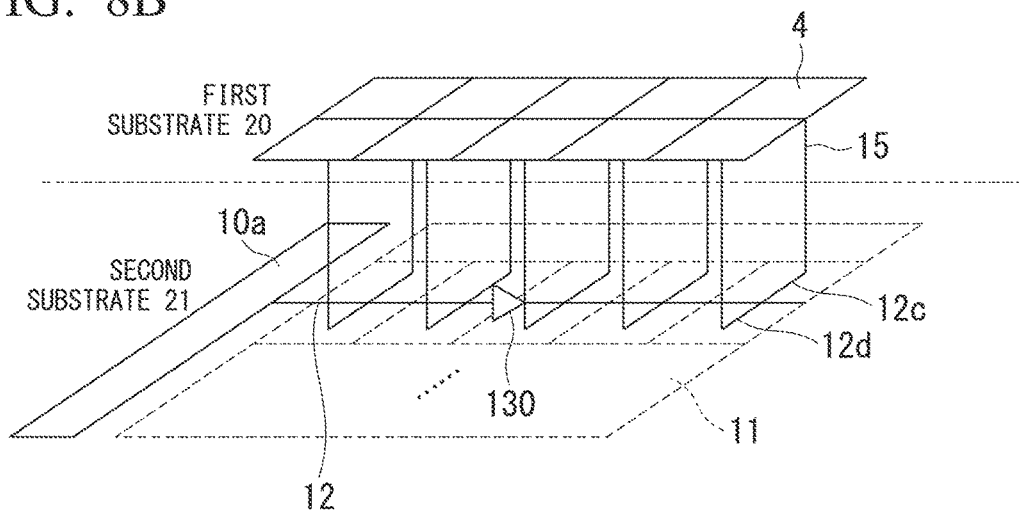
FIG. 8B is a perspective view showing a configuration of the second substrate of the image capturing device according to the first embodiment of the present invention.

Although one first buffer 130 is arranged for every row of the plurality of pixels 4 in FIGS. 1 and 2, the present invention is not limited thereto. For example, one first buffer 130 may be arranged for every two or more rows of the plurality of pixels 4. FIGS. 8A and 8B show an example in which one first buffer 130 is arranged for every two or more rows of the plurality of pixels 4.

FIG. 8A shows the wiring of the pixel control signal lines 12 in the second substrate 21. In FIG. 8A, one pixel control signal line 12 and one first buffer 130 are arranged for every two rows of the plurality of pixels 4. Accordingly, in FIG. 8A, each first buffer 130 is provided in correspondence with two rows of the plurality of pixels 4 and arranged at a position overlapping the pixel unit 3. The pixel control signal line 12 corresponding to the two rows of the plurality of pixels 4 branches along the way into pixel control signal lines 12c and 12d, each of which is arranged for every pixel, in the area 11 immediately below the pixels. The pixel control signal lines 12c and 12d are connected to the through-electrodes 15 of the pixels 4 corresponding thereto.

FIG. 8B shows an example of connections related to control signals supplied to two rows of the plurality of pixels 4. FIG. 8B shows only a configuration related to the two rows of the plurality of pixels 4. The through-electrode 15 connecting the first substrate 20 and the second substrate 21 is arranged in correspondence with each pixel 4. A control signal for two rows output from the first vertical scanning circuit 10a is transmitted to the pixel control signal line 12, divided along the way for pixel control signal lines 12c and 12d, each of which is arranged for every pixel, and transmitted to the pixel control signal lines 12c and 12d. The control signals transmitted to the pixel control signal lines 12c and 12d are transferred to the first substrate 20 via the through-electrodes 15 and transmitted to the pixels 4. Accordingly, the pixel control signal lines 12, 12c, and 12c and the through-electrodes 15 shown in FIGS. 8A and 8B constitute a path through which the control signal output from the first vertical scanning circuit 10a is transmitted to the two rows of the plurality of pixels 4.

Figure 9A:
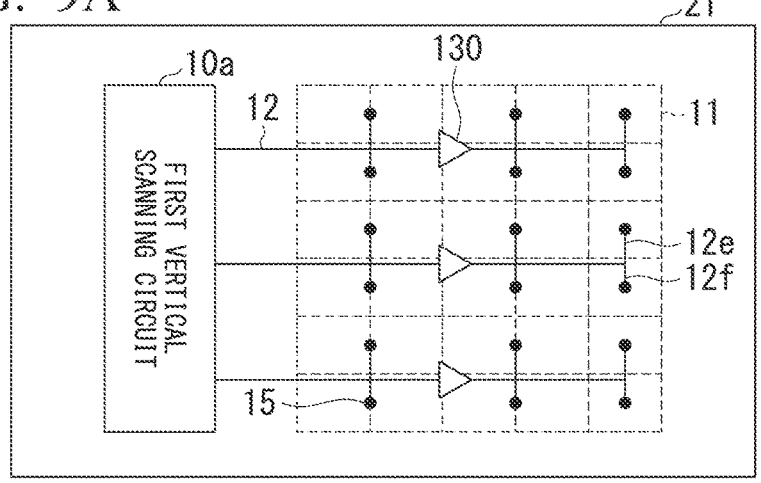
FIG. 9A is a block diagram showing a configuration of the second substrate of the image capturing device according to the first embodiment of the present invention.
Figure 9B:
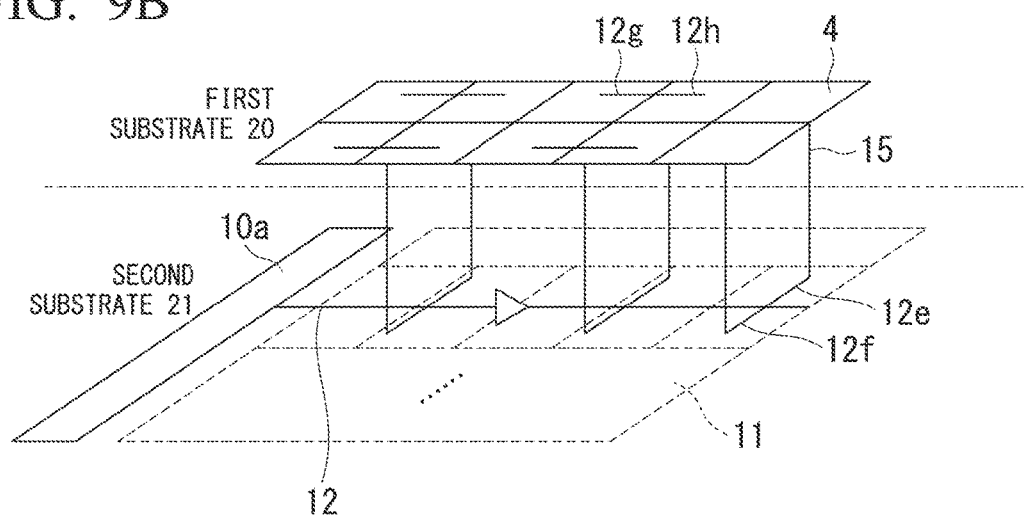
FIG. 9B is a perspective view showing a configuration of the second substrate of the image capturing device according to the first embodiment of the present invention.

FIGS. 9A and 9B show another example in which one first buffer 130 is arranged for every two or more rows of the plurality of pixels 4. FIG. 9A shows the wiring of the pixel control signal line 12 in the second substrate 21. In FIG. 9A, one pixel control signal line 12 and one first buffer 130 are arranged for every two rows of the plurality of pixels 4. Accordingly, in FIG. 9A, each first buffer 130 is provided in correspondence with two rows of the plurality of pixels 4 and arranged at a position overlapping the pixel unit 3. The pixel control signal line 12 corresponding to the two rows of the plurality of pixels 4 branches along the way into pixel control signal lines 12e and 12f, each of which is arranged for every pixel or every two pixels of the same row, in the area 11 immediately below the pixels. The pixel control signal lines 12e and 12f are connected to the through-electrodes 15 of one or two pixels 4 corresponding thereto.

FIG. 9B shows an example of connections related to control signals supplied to two rows of the plurality of pixels 4. FIG. 9B shows only a configuration related to the two rows of the plurality of pixels 4. The through-electrodes 15 connecting the first substrate 20 and the second substrate 21 are arranged in correspondence with one pixel 4 or two pixels 4 of the same row. A control signal for two rows output from the first vertical scanning circuit 10a is transmitted to the pixel control signal line 12, divided along the way for pixel control signal lines 12e and 12f, each of which is arranged for every pixel or every two pixels of the same row, and transmitted to the pixel control signal lines 12e and 12f. The control signals transmitted to the pixel control signal lines 12e and 12f are transferred to the first substrate 20 via the through-electrodes 15.

In some pixels 4, the control signal transferred to the first substrate 20 via the through-electrode 15 is transmitted to the pixel 4 without being divided in two. In the remaining pixels 4, the control signal transferred to the first substrate 20 via the through-electrode 15 is divided for pixel control signal lines 12g and 12h, each of which is arranged for every pixel, and transmitted through the pixel control signal lines 12g and 12h. The control signals transmitted through the pixel control signal lines 12g and 12h are transmitted to the pixels 4. Accordingly, the pixel control signal lines 12, 12e, 12f, 12g, and 12h and the through-electrodes 15 shown in FIGS. 9A and 9B constitute a path through which the control signals output from the first vertical scanning circuit 10a are transmitted to two rows of the plurality of pixels 4.

Because the through-electrodes 15 are shared by every two pixels of the same row in FIGS. 9A and 9B, the number of through-electrodes 15 can be reduced as compared with FIGS. 8A and 8B. Therefore, in FIGS. 9A and 9B, as compared with FIGS. 8A and 8B, the through-electrodes 15 can be formed to be thicker and the yield is improved.

Figure 10:
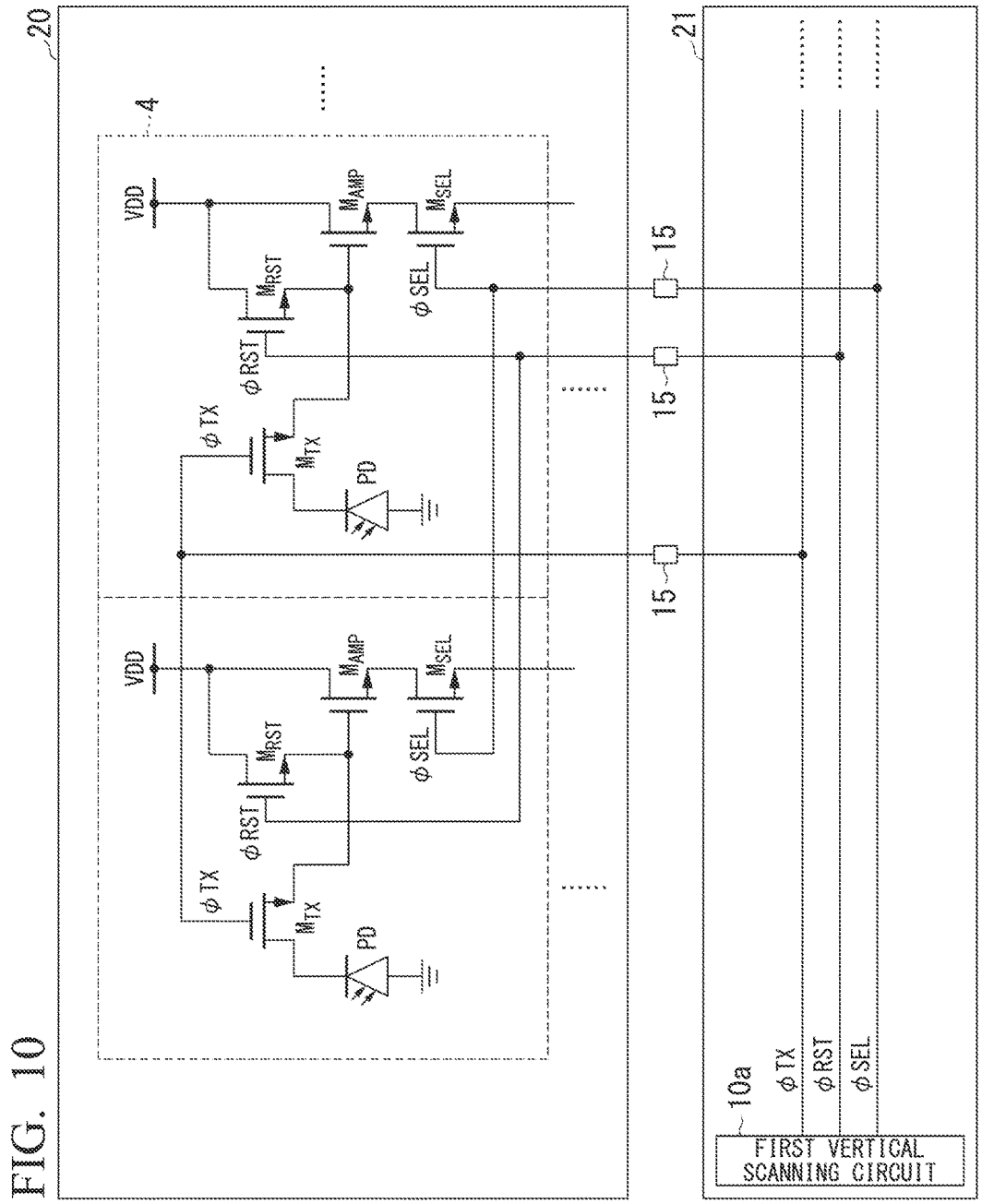
FIG. 10 is a schematic diagram showing a configuration of a pixel and connections related to control signals in the image capturing device according to the first embodiment of the present invention.

FIG. 10 shows an example of a configuration of the pixels 4 and connections related to control signals supplied to the pixels 4 in an example (FIGS. 9A and 9B) in which the through-electrodes 15 are shared by every two pixels of the same row. In FIG. 10, gates of transistors of the two pixels of the same row are connected to each other through the pixel control signal lines 12g and 12h shown in FIGS. 9A and 9B. More specifically, the gates of the transfer transistors $M_{TX}$ of the two pixels of the same row are connected to each other, the gates of the reset transistors $M_{RST}$ of the two pixels of the same row are connected to each other, and the gates of the select transistors $M_{SEL}$ of the two pixels of the same row are connected to each other.

Figure 11A:
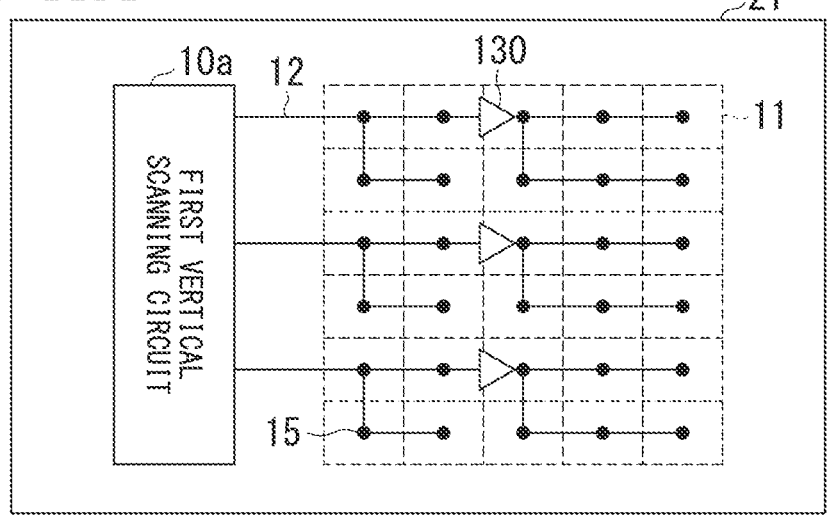
FIG. 11A is a block diagram showing a configuration of the second substrate of the image capturing device according to the first embodiment of the present invention.
Figure 11B:
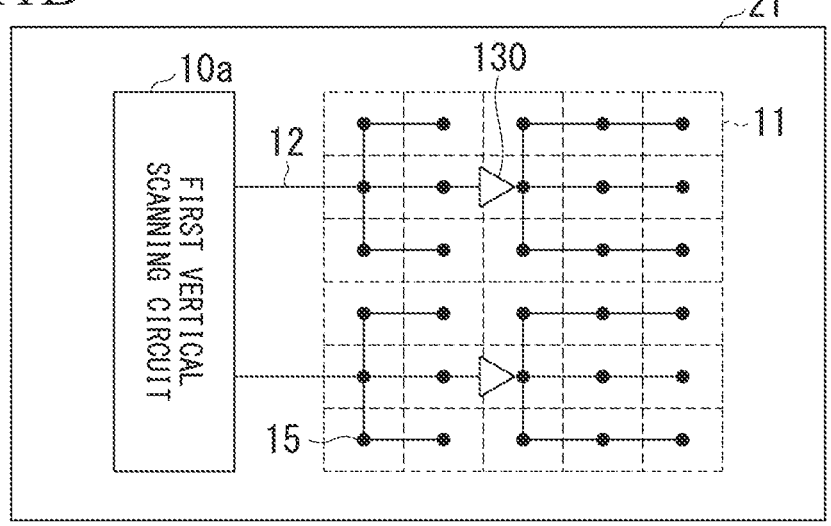
FIG. 11B is a block diagram showing a configuration of the second substrate of the image capturing device according to the first embodiment of the present invention.

FIGS. 11A and 11B show other examples in which one first buffer 130 is arranged for every two or more rows of the plurality of pixels 4. FIGS. 11A and 11B show the wiring of the pixel control signal line 12 in the second substrate 21.

In FIG. 11A, one pixel control signal line 12 and one first buffer 130 are arranged for every two rows of the plurality of pixels. In FIG. 11B, one pixel control signal line 12 and one first buffer 130 are arranged for every three rows of the plurality of pixels 4. In both of FIGS. 11A and 11B, the pixel control signal line 12 branches along the way in the area 11 immediately below the pixels. A control signal for two rows or three rows output from the first vertical scanning circuit 10a is transmitted to the pixel control signal line 12 and divided along the way for two or three pixel control signal lines. The two or three pixel control signal lines are connected to the through-electrode 15 arranged for every pixel. The control signals transmitted to the two or three pixel control signal lines are transferred to the first substrate 20 via the through-electrodes 15 and transmitted to the pixels 4.

Although the first buffers 130 are arranged in the vicinity of the center of the area 11 immediately below the pixels in FIG. 1, the present invention is not limited thereto. The first buffer 130 may be arranged at any position along the pixel control signal line 12. Although it is desirable for the first buffer 130 to be arranged in the area 11 immediately below the pixels, the first buffer 130 may be arranged between the area 11 immediately below the pixels and the first vertical scanning circuit 10a.

Although the first vertical scanning circuit 10a is arranged on the second substrate 21 in FIG. 1, the present invention is not limited thereto. It is only necessary for the first vertical scanning circuit 10a to be arranged on one of the first substrate 20 and the second substrate 21. The first substrate 20 and the second substrate 21 are configured so that the control signal output from the first vertical scanning circuit 10a is transferred to the second substrate 21 and output to the pixel control signal line 12 when the first vertical scanning circuit 10a is arranged on the first substrate 20.

Although an example in which the first substrate 20 and the second substrate 21 are connected to each other through the through-electrodes 15 is shown, a method of configuring the first substrate 20 to be of a backside irradiation type and establishing an electrical connection between the first substrate 20 and the second substrate 21 by a conductive bump or the like may be used.

According to this embodiment, the image capturing device 1a includes: the first substrate 20; the second substrate 21 arranged so that the second substrate 21 overlaps the first substrate 20; the pixel unit 3 having the plurality of pixels 4 arranged in a matrix shape on the first substrate 20; the first vertical scanning circuit 10a arranged on one of the first substrate 20 and the second substrate 21 and configured to output a control signal supplied to every row or every two or more rows of the plurality of pixels 4; and the plurality of first buffers 130 arranged on the second substrate 21 so that the first buffers 130 overlap the pixel unit 3, provided in correspondence with one row or a plurality of rows of the plurality of pixels 4, and connected to signal lines (the pixel control signal lines 12) through which the control signal output from the first vertical scanning circuit 10a is transmitted.

In this embodiment, there is substantially no deviation in the supply timing of a control signal in a pixel 4 close to the first vertical scanning circuit 10a, and the wiring resistance, the capacitance between wirings, and the load to the pixel 4 close to the first vertical scanning circuit 10a are small. Thus, the pixel 4 close to the first vertical scanning circuit 10a can receive a control signal of a sharp waveform.

In this embodiment, the first buffer 130 is connected to the pixel control signal line 12, and a control signal is supplied to a pixel 4 distant from the first vertical scanning circuit 10a via the first buffer 130. The control signal via the first buffer 130 is shaped by the first buffer 130. Thus, the wiring resistance, the capacitance between wirings, and the load to the pixel 4 distant from the first vertical scanning circuit 10a substantially become the wiring resistance, the capacitance between wirings, and the load from the first buffer 130. Accordingly, as compared with when no first buffer 130 is arranged, the wiring resistance, the capacitance between wirings, and the load to the pixel 4 distant from the first vertical scanning circuit 10a are reduced. Thus, the deviation in the supply timing of the selection signal can be limited, and the pixel 4 distant from the first vertical scanning circuit 10a can receive the control signal of the sharp waveform.

(Second Embodiment)

Figure 12:
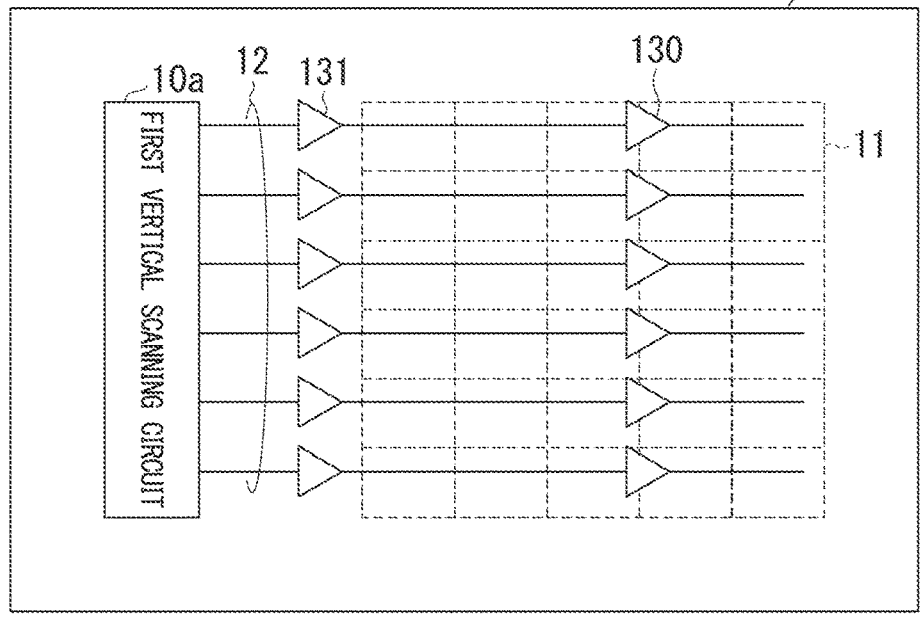
FIG. 12 is a block diagram showing a configuration of a second substrate of an image capturing device according to a second embodiment of the present invention.

Next, the second embodiment of the present invention will be described. The image capturing device according to this embodiment is configured by replacing the second substrate 21 shown in FIG. 1 with a second substrate 22 shown in FIG. 12. FIG. 12 shows a configuration of the second substrate 22. The second substrate 22 shown in FIG. 12 is different from the second substrate 21 shown in FIG. 1 in that a plurality of second buffers 131 are arranged between a first vertical scanning circuit 10a and an area 11 immediately below pixels on the second substrate 22.

The second buffer 131 is provided in correspondence with one row of a plurality of pixels 4, and connected to a pixel control signal line 12 to which the first buffer 130 is connected. The second buffer 131 is arranged at a position at which the second buffer 131 does not overlap a pixel unit 3.

A control signal output from the first vertical scanning circuit 10a is transmitted to the pixel control signal line 12 and input to the second buffer 131. The control signal output from the second buffer 131 is transmitted to the pixel control signal line 12 and input to the first buffer 130. The control signal output from the first buffer 130 is transmitted to the pixel control signal line 12. Accordingly, the control signal via the first buffer 130 and the second buffer 131 is supplied to some of the plurality of pixels 4 (two columns of pixels 4 denoted by reference signs P14 to P64 and P15 to P65 in FIG. 1).

A configuration of the first substrate 20 is the same as the configuration of the first substrate 20 in the first embodiment. Also, a method of connecting the first substrate 20 and the second substrate 22 is the same as the method of connecting the first substrate 20 and the second substrate 21 in the first embodiment.

Although one pixel control signal line 12 is arranged for every row of the plurality of pixels 4 in FIG. 12, the present invention is not limited thereto. For example, one pixel control signal line 12 may be arranged for every two or more rows of the plurality of pixels 4.

Although one buffer is arranged for every row of the plurality of pixels 4 in FIG. 12, the present invention is not limited thereto. For example, one buffer may be arranged for every two or more rows of the plurality of pixels 4.

Although one second buffer 131 is arranged in correspondence with one row of the plurality of pixels 4 in FIG. 12, a plurality of second buffers 131 may be arranged in correspondence with one row of the plurality of pixels 4. Accordingly, two or more second buffers 131 may be arranged between the first vertical scanning circuit 10a and the area 11 immediately below the pixels in correspondence with one row of the plurality of pixels 4, and the two or more second buffers 131 may be connected to each other by pixel control signal lines 12.

Although the first vertical scanning circuit 10a is arranged on the second substrate 22 in FIG. 12, the present invention is not limited thereto. It is only necessary for the first vertical scanning circuit 10a to be arranged on one of the first substrate 20 and the second substrate 22. The first substrate 20 and the second substrate 22 are configured so that the control signal output from the first vertical scanning circuit 10a is transferred to the second substrate 22 and output to the pixel control signal line 12 when the first vertical scanning circuit 10a is arranged on the first substrate 20.

According to this embodiment, the image capturing device includes the plurality of second buffers 131 arranged on the second substrate 22, provided in correspondence with one row or a plurality of rows of the plurality of pixels 4, and connected to signal lines (the pixel control signal lines 12) to which the first buffers 130 are connected.

In this embodiment, the plurality of second buffers 131 are arranged between the first vertical scanning circuit 10a and the area 11 immediately below the pixels in addition to the first buffers 130. Thereby, the driving capability of the pixel control signal output from the first vertical scanning circuit 10a becomes high. Accordingly, the deviation in the supply timing of the control signal is reduced more than in the first embodiment, and the pixel 4 distant from the first vertical scanning circuit 10a can receive a control signal of a sharp waveform.

(Third Embodiment)

Figure 13:
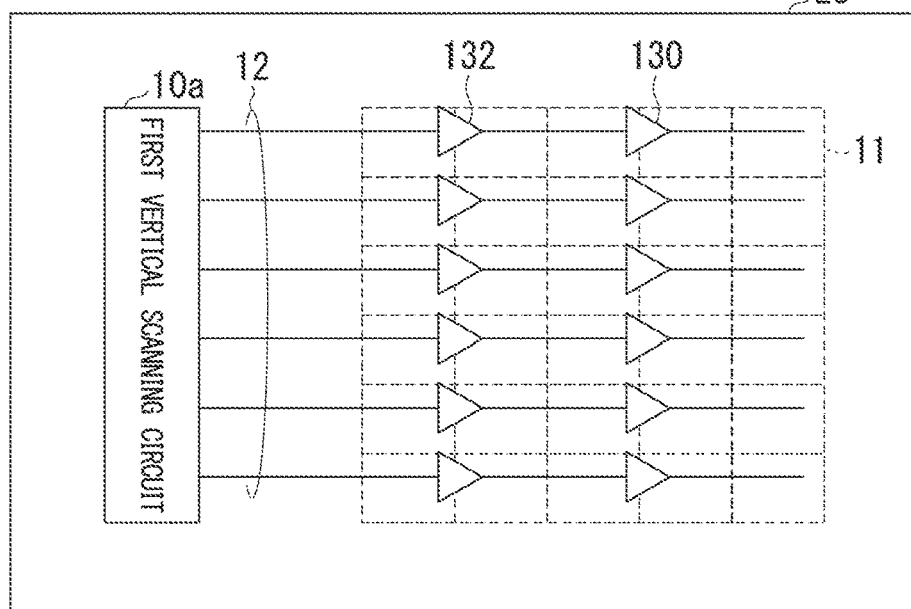
FIG. 13 is a block diagram showing a configuration of a second substrate of an image capturing device according to a third embodiment of the present invention.

Next, the third embodiment of the present invention will be described. The image capturing device according to this embodiment is configured by replacing the second substrate 21 shown in FIG. 1 with a second substrate 23 shown in FIG. 13. FIG. 13 shows a configuration of the second substrate 23. The second substrate 23 shown in FIG. 13 is different from the second substrate 22 shown in FIG. 12 in that second buffers 132 are arranged in place of the second buffers 131.

In this embodiment, the second buffers 132 are arranged in an area 11 immediately below pixels. Accordingly, the second buffers 132 are arranged so that the second buffers 132 overlap a pixel unit 3. In the area 11 immediately below the pixels, it is possible to arrange the second buffers 132 at any position other than positions at which the first buffers 130 are arranged.

A configuration of the first substrate 20 is the same as the configuration of the first substrate 20 in the first embodiment. Also, a method of connecting the first substrate 20 and the second substrate 23 is the same as the method of connecting the first substrate 20 and the second substrate 21 in the first embodiment.

Although one pixel control signal line 12 is arranged for every row of the plurality of pixels 4 in FIG. 13, the present invention is not limited thereto. For example, one pixel control signal line 12 may be arranged for every two or more rows of the plurality of pixels 4.

Although one buffer is arranged for every row of the plurality of pixels 4 in FIG. 13, the present invention is not limited thereto. For example, one buffer may be arranged for every two or more rows of the plurality of pixels 4.

Although one second buffer 132 is arranged in correspondence with one row of the plurality of pixels 4 in FIG. 13, a plurality of second buffers 132 may be arranged in correspondence with one row of the plurality of pixels 4. Accordingly, two or more second buffers 132 may be arranged in the area 11 immediately below the pixels in correspondence with one row of the plurality of pixels 4, and the two or more second buffers 132 may be connected to each other by the pixel control signal lines 12.

Although the first vertical scanning circuit 10a is arranged in the second substrate 23 in FIG. 13, the present invention is not limited thereto. It is only necessary for the first vertical scanning circuit 10a to be arranged on one of the first substrate 20 and the second substrate 23. The first substrate 20 and the second substrate 23 are configured so that the control signal output from the first vertical scanning circuit 10a is transferred to the second substrate 23 and output to the pixel control signal line 12 when the first vertical scanning circuit 10a is arranged on the first substrate 20.

According to this embodiment, an image capturing device in which the plurality of second buffers 132 are arranged so that the second buffers 132 overlap the pixel unit 3 is configured.

Because the second buffers 132 are arranged in the area 11 immediately below the pixels in this embodiment, it is possible to make a distance between the first buffer 130 and the second buffer 132 shorter than a distance between the first buffer 130 and the second buffer 131 in the second embodiment. Accordingly, the wiring resistance, the wiring capacitance, and the load between the first buffer 130 and the second buffer 132 are reduced. Thereby, the deviation in the supply timing of the control signal can be reduced more than in the second embodiment. Also, even when the number of pixels increases, the pixel 4 distant from the first vertical scanning circuit 10a can receive the control signal of a sharp waveform by appropriately setting a distance between the first buffer 130 and the second buffer 132 and a distance to a pixel 4 most distant from the first buffer 130.

(Fourth Embodiment)

Figure 14:
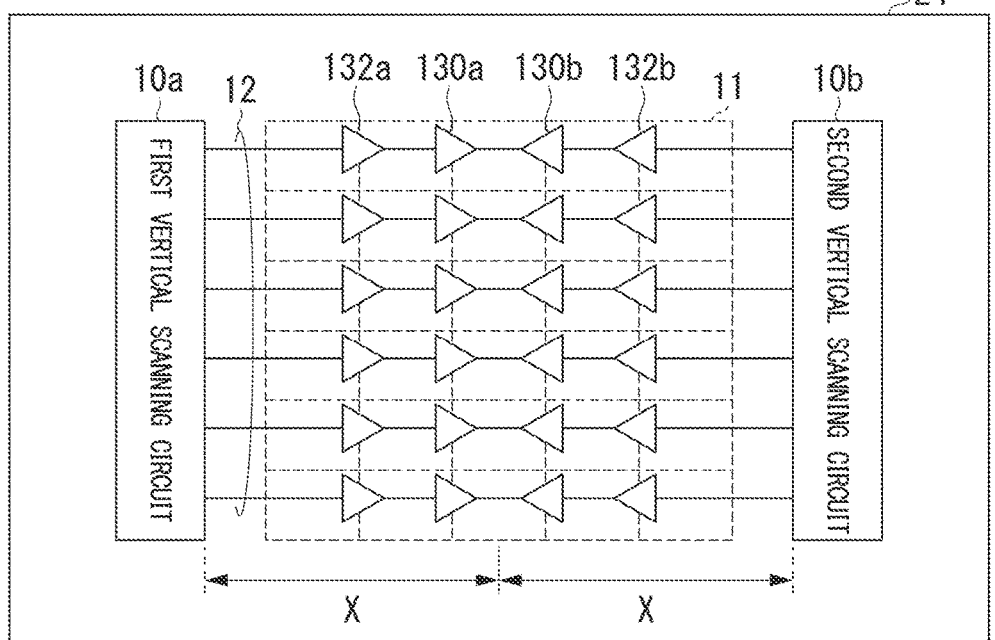
FIG. 14 is a block diagram showing a configuration of a second substrate of an image capturing device according to a fourth embodiment of the present invention.

Next, the fourth embodiment of the present invention will be described. The image capturing device according to this embodiment is configured by replacing the second substrate 21 shown in FIG. 1 with a second substrate 24 shown in FIG. 14. FIG. 14 shows a configuration of the second substrate 24. The second substrate 24 shown in FIG. 14 is different from the second substrate 22 shown in FIG. 12 in that a second vertical scanning circuit 10b is arranged and a plurality of first buffers 130a and 130b and a plurality of second buffers 132a and 132b are arranged in an area 11 immediately below the pixels.

The second vertical scanning circuit 10b is arranged on the right side of the area 11 immediately below the pixels. That is, the area 11 immediately below the pixels is sandwiched between the first vertical scanning circuit 10a and the second vertical scanning circuit 10b which face each other.

The second vertical scanning circuit 10b outputs a control signal supplied to each row of the plurality of pixels 4 in synchronization with the first vertical scanning circuit 10a. Because the first vertical scanning circuit 10a and the second vertical scanning circuit 10b are synchronized with each other, timings at which the same type of control signals output to the same row of the plurality of pixels 4 by the first vertical scanning circuit 10a and the second vertical scanning circuit 10b change are equal.

The first buffer 130a and the second buffer 132a are arranged at positions at which a distance from the first vertical scanning circuit 10a is less than or equal to a distance X, and the first buffer 130b and the second buffer 132b are arranged at positions at which a distance from the second vertical scanning circuit 10b is less than or equal to X. The distance X is a distance of the half of the distance between the first vertical scanning circuit 10a and the second vertical scanning circuit 10b. The first buffers 130a and 130b are arranged so that output terminals thereof face each other, and the second buffers 132a and 132b are arranged so that output terminals thereof face each other. Control signals are simultaneously output from two vertical scanning circuits arranged on both sides of the area 11 immediately below the pixels, so that the transmission distance of the control signal becomes about half (the distance X of FIG. 14) of the length of the pixel control signal line 12.

The plurality of pixels 4 provided in the pixel unit 3 include first pixels (two columns of pixels 4 denoted by reference signs P11 to P61 and P12 to P62 in FIG. 1) and second pixels (two columns of pixels 4 denoted by reference signs P14 to P64 and P15 to P65 in FIG. 1) arranged in the same rows. A control signal output from the first vertical scanning circuit 10a is supplied to the first pixels. Also, a control signal output from the second vertical scanning circuit 10b is supplied to the second pixels. A control signal output from one of the first vertical scanning circuit 10a and the second vertical scanning circuit 10b is supplied to the remaining pixels (one column of pixels 4 denoted by reference signs P13 to P63 in FIG. 1).

A configuration of the first substrate 20 is the same as the configuration of the first substrate 20 in the first embodiment. Also, a method of connecting the first substrate 20 and the second substrate 24 is the same as the method of connecting the first substrate 20 and the second substrate 21 in the first embodiment.

Although the second buffers 132a and 132b are arranged in FIG. 14, no second buffers 132a and 132b may be arranged as described in the first embodiment. Also, although the second buffers 132a and 132b are arranged in the area 11 immediately below the pixels in FIG. 14, the second buffer 132a may be arranged between the first vertical scanning circuit 10a and the area 11 immediately below the pixels, and the second buffers 132b may be arranged between the second vertical scanning circuit 10b and the area 11 immediately below the pixels as described in the second embodiment.

Although one pixel control signal line 12 is arranged for every row of the plurality of pixels 4 in FIG. 14, the present invention is not limited thereto. For example, one pixel control signal line 12 may be arranged for every two or more rows of the plurality of pixels 4.

Although one buffer is arranged for every row of the plurality of pixels 4 in FIG. 14, the present invention is not limited thereto. For example, one buffer may be arranged for every two or more rows of the plurality of pixels 4.

Although the first vertical scanning circuit 10a and the second vertical scanning circuit 10b are arranged on the second substrate 24 in FIG. 14, the present invention is not limited thereto. The first vertical scanning circuit 10a and the second vertical scanning circuit 10b may be arranged on one of the first substrate 20 and the second substrate 24. The first substrate 20 and the second substrate 24 are configured so that control signals output from the first vertical scanning circuit 10a and the second vertical scanning circuit 10b are transferred to the second substrate 24 and output to the pixel control signal line 12 when the first vertical scanning circuit 10a and the second vertical scanning circuit 10b are arranged on the first substrate 20.

According to this embodiment, the image capturing device further includes the second vertical scanning circuit 10b arranged on one of the first substrate 20 and the second substrate 24 and configured to output a control signal supplied to every row or every two or more rows of a plurality of pixels 4 in synchronization with the first vertical scanning circuit 10a, wherein the plurality of pixels 4 include first and second pixels arranged in the same row, the control signal output from the first vertical scanning circuit 10a is supplied to the first pixel, and the control signal output from the second vertical scanning circuit 10b is supplied to the second pixel.

In this embodiment, the transmission distance of the control signal is shortened because two vertical scanning circuits are arranged. Accordingly, the deviation in the supply timing of the control signal can be further reduced because the wiring resistance, the wiring capacitance, and the load are further reduced.

(Fifth Embodiment)

Figure 15:
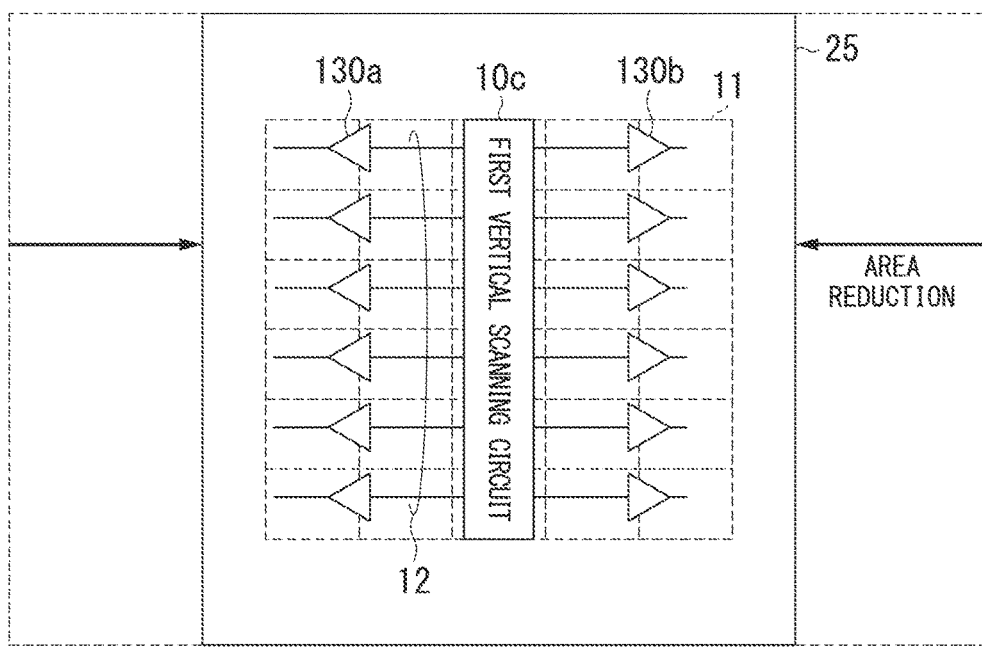
FIG. 15 is a block diagram showing a configuration of a second substrate of an image capturing device according to a fifth embodiment of the present invention.

Next, the fifth embodiment of the present invention will be described. The image capturing device according to this embodiment is configured by replacing the second substrate 21 shown in FIG. 1 with a second substrate 25 shown in FIG. 15. FIG. 15 shows a configuration of the second substrate 25. The second substrate 25 shown in FIG. 15 is different from the second substrate 21 shown in FIG. 1 in that a first vertical scanning circuit 10c and a plurality of first buffers 130a and 130b are arranged in an area 11 immediately below pixels.

The first vertical scanning circuit 10c is arranged at the center of the area 11 immediately below the pixels. Accordingly, the first vertical scanning circuit 10c is arranged so that the first vertical scanning circuit 10c overlaps the pixel unit 3. In the area 11 immediately below the pixels, the first vertical scanning circuit 10c can be arranged at a position at which the first buffers 130a and 130b are not arranged. It is possible to supply the control signal to the pixel 4 positioned immediately above the first vertical scanning circuit 10c by arranging a signal line on the first vertical scanning circuit 10c.

The pixel control signal lines 12 extend from the first vertical scanning circuit 10c to the left and right sides. In the area 11 immediately below the pixels, the first buffers 130a are arranged in an area on the left side of the first vertical scanning circuit 10c, and the first buffers 130b are arranged in an area on the right side of the first vertical scanning circuit 10c. The first buffers 130a and 130b are arranged so that input terminals thereof face each other.

It is only necessary for the first vertical scanning circuit 10c to at least partially overlap the area 11 immediately below the pixels. That is, it is only necessary for the first vertical scanning circuit 10c to at least partially overlap the pixel unit 3.

A configuration of the first substrate 20 is the same as the configuration of the first substrate 20 in the first embodiment. Also, a method of connecting the first substrate 20 and the second substrate 25 is the same as the method of connecting the first substrate 20 and the second substrate 21 in the first embodiment.

Although one pixel control signal line 12 is arranged for every row of the plurality of pixels 4 in FIG. 15, the present invention is not limited thereto. For example, one pixel control signal line 12 may be arranged for every two or more rows of the plurality of pixels 4.

Although one buffer is arranged for every row of the plurality of pixels 4 in FIG. 15, the present invention is not limited thereto. For example, one buffer may be arranged for every two or more rows of the plurality of pixels 4.

Although the first buffers 130a and 130b are arranged in FIG. 15, the second buffers 132a and 132b in FIG. 14 may be arranged in addition to the first buffers 130a and 130b.

According to this embodiment, the image capturing device is configured so that the first vertical scanning circuit 10c is arranged so that the first vertical scanning circuit 10c at least partially overlaps the pixel unit 3.

In this embodiment, the lengths of the pixel control signal lines 12 to the pixels 4 of both ends of the left and right are further shortened than when one vertical scanning circuit is arranged outside the area 11 immediately below the pixels.

Accordingly, because the wiring resistance, the wiring capacitance, and the load are reduced, it is possible to reduce the deviation in the supply timing of the control signal. Also, the first vertical scanning circuit 10c and the area 11 immediately below the pixels overlap each other, so that a substrate area can be reduced.

(Sixth Embodiment)

Figure 16:
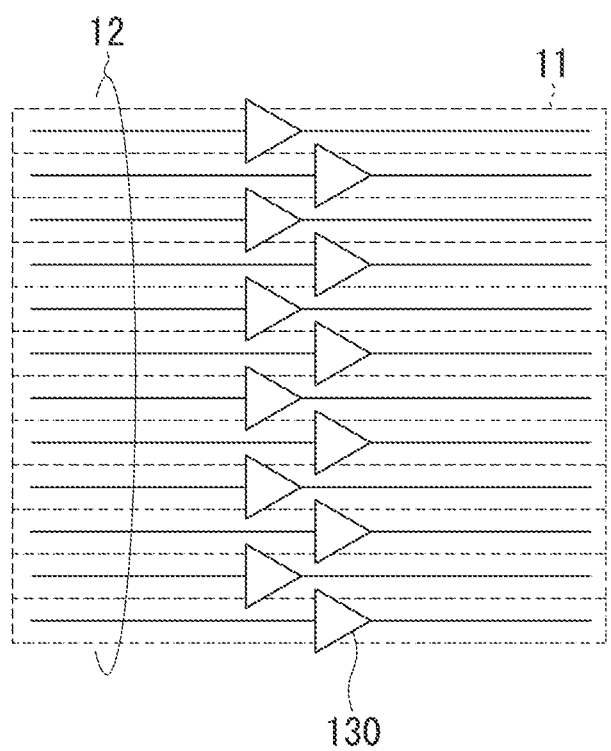
FIG. 16 is a block diagram showing a configuration of an area immediately below pixels of an image capturing device according to a sixth embodiment of the present invention.

Next, the sixth embodiment of the present invention will be described. The image capturing device according to this embodiment is configured by replacing the configuration of the area 11 immediately below the pixels shown in FIG. 1 with a configuration of an area 11 immediately below the pixels shown in FIG. 16. FIG. 16 shows the configuration of the area 11 immediately below the pixels. The area 11 immediately below the pixels has a plurality of pixel control signal lines 12 and a plurality of first buffers 130.

Among the plurality of first buffers 130, two first buffers 130 arranged in two rows adjacent to each other are arranged so that the two first buffers 130 are displaced from each other in the row direction. In FIG. 16, a first buffer 130 arranged in an even row is displaced in a right direction from a first buffer 130 arranged in an adjacent odd row. Positions of the plurality of first buffers 130 arranged in even rows in the row direction are the same, and positions of the plurality of first buffers 130 arranged in odd rows in the row direction are the same. The arrangement position, number, and direction of the shown buffers do not necessarily match the actual arrangement position, number, and direction. In three or more continuous rows, two buffers arranged in any two rows adjacent to each other may be arranged so that the two buffers are displaced from each other in the row direction.

According to this embodiment, the image capturing device is configured so that two first buffers 130 arranged in two rows adjacent to each other among a plurality of first buffers 130 are arranged so that the two first buffers 130 are displaced from each other in the row direction.

In this embodiment, the first buffers 130 are arranged in the same position of the row direction in every other row. When the number of pixels is large, it is possible to further increase a size of the buffer by arranging one buffer for every two rows.

Thereby, it is possible to further limit the deviation in the supply timing of the control signal because it is possible to increase the driving capability of the buffer.

(Seventh Embodiment)

Figure 17:
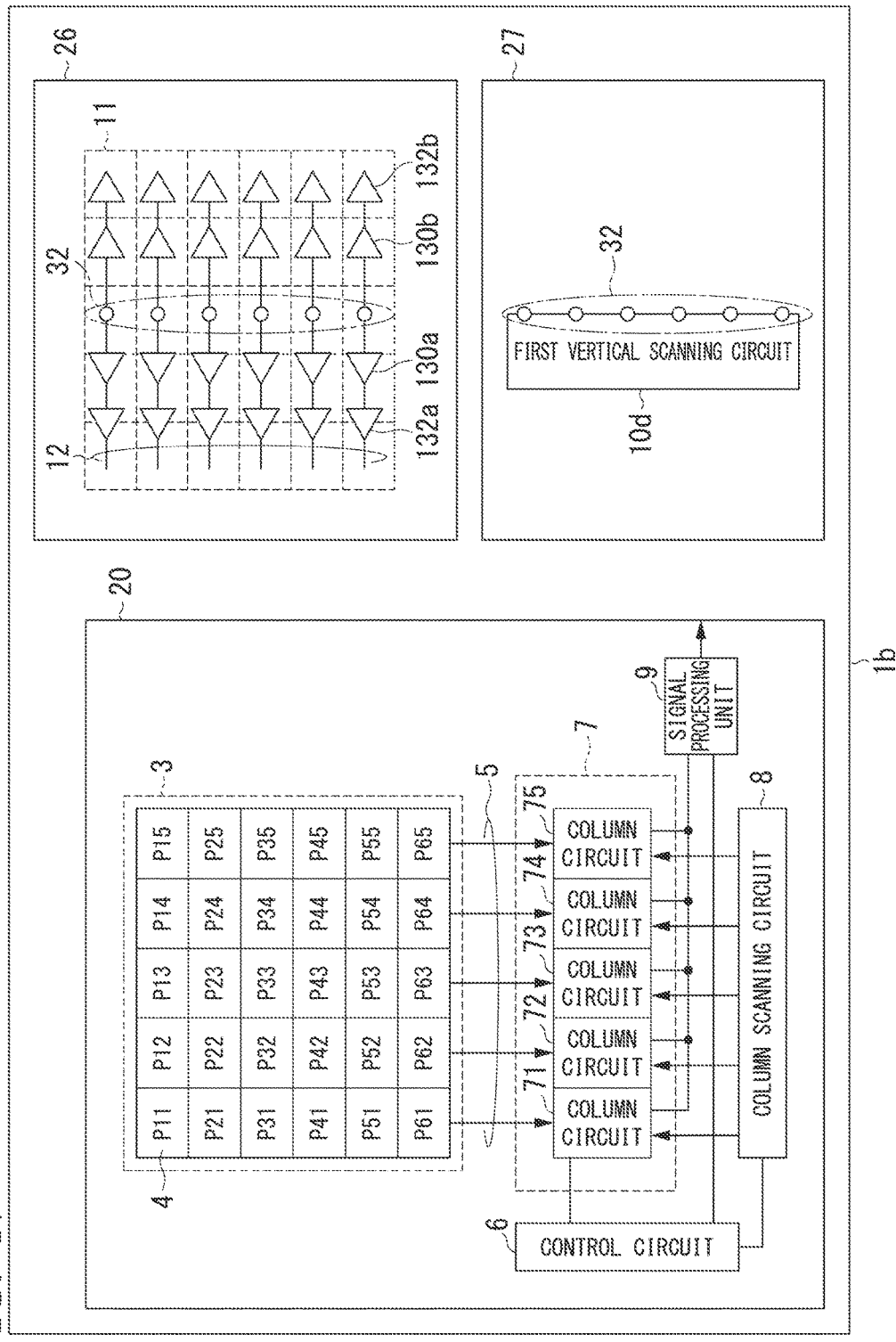
FIG. 17 is a block diagram showing a configuration of an image capturing device according to a seventh embodiment of the present invention.

Next, the seventh embodiment of the present invention will be described. FIG. 17 shows a configuration of an image capturing device 1b according to this embodiment. The image capturing device 1b has three substrates which are a first substrate 20, a second substrate 26, and a third substrate 27. Although the first substrate 20, the second substrate 26, and the third substrate 27 are arranged next to one another in FIG. 17, the substrates are actually arranged so that the substrates overlap each other.

In FIG. 17, the second substrate 26 is arranged between the first substrate 20 and the third substrate 27. In other words, each of the first substrate 20, the second substrate 26, and the third substrate 27 has two surfaces, and the first substrate 20, the second substrate 26, and the third substrate 27 are arranged so that a first surface of the first substrate 20 and a first surface of the second substrate 26 face each other and a second surface of the second substrate 26 (a surface opposite to the surface of the second substrate 26 facing the first substrate 20) and a first surface of the third substrate 27 face each other. In this case, the first substrate 20 and the second substrate 26 are electrically connected to each other, and the second substrate 26 and the third substrate 27 are electrically connected to each other.

The configuration of the first substrate 20 is the same as the configuration of the first substrate 20 in the first embodiment.

The second substrate 26 has an area 11 immediately below the pixels, a plurality of pixel control signal lines 12, a plurality of first buffers 130a and 130b, and a plurality of second buffers 132a and 132b. In the area 11 immediately below the pixels, the first buffers 130a and 130b and the second buffers 132a and 132b are arranged in the middle of the pixel control signal line 12. The first buffers 130a and the second buffers 132a are arranged in an area of a left half of the area 11 immediately below the pixels, and the first buffer 130b and the second buffer 132b are arranged in an area of a right half of the area 11 immediately below the pixels. The first buffers 130a and 130b are arranged so that input terminals thereof face each other, and the second buffers 132a and 132b are arranged so that input terminals thereof face each other.

The first buffers 130a and 130b and the second buffers 132a and 132b are arranged one by one with respect to one pixel control signal line 12. These buffers are arranged at points along the pixel control signal lines 12 and connected to the pixel control signal lines 12. Accordingly, each buffer is provided in correspondence with one row of the plurality of pixels 4 and arranged at a position overlapping the pixel unit 3.

The third substrate 27 has a first vertical scanning circuit 10d configured to output a control signal supplied to each row of the plurality of pixels 4. The first vertical scanning circuit 10d is arranged at a position corresponding to the center of the area 11 immediately below the pixels.

The first substrate 20 and the second substrate 26 are connected to each other by the through-electrodes 15 shown in FIG. 3 or the like. In addition, the second substrate 26 and the third substrate 27 are connected to each other by through-electrodes 32. In FIG. 17, one through-electrode 32 is arranged for every row of the plurality of pixels 4, and an output terminal of the first vertical scanning circuit 10d and the pixel control signal line 12 are connected to each other by the through-electrode 32. The through-electrode 32 is arranged in the vicinity of the center of the area 11 immediately below the pixels.

A control signal output from the first vertical scanning circuit 10d is transferred to the pixel control signal lines 12 via the through-electrodes 32. The control signal transferred to the pixel control signal lines 12 is transmitted to the pixel control signal lines 12 and input to each of the first buffers 130a and 30b. The control signal output from the first buffers 130a is transmitted to the pixel control signal lines 12 and input to the second buffers 132a. The control signal output from the second buffers 132a is transmitted to the pixel control signal lines 12. Also, the control signal output from the first buffers 130b is transmitted to the pixel control signal lines 12 and input to the second buffers 132b.

Although the second substrate 26 is arranged between the first substrate 20 and the third substrate 27 in FIG. 17, the third substrate 27 may be arranged between the first substrate 20 and the second substrate 26. In other words, each of the first substrate 20, the second substrate 26, and the third substrate 27 has two surfaces, and the first substrate 20, the second substrate 26, and the third substrate 27 are arranged so that a first surface of the first substrate 20 and a first surface of the third substrate 27 face each other and a second surface of the third substrate 27 (a surface opposite to the surface of the third substrate 27 facing the first substrate 20)

and a first surface of the second substrate 26 face each other. In this case, the first substrate 20 and the third substrate 27 are electrically connected to each other, and the third substrate 27 and the second substrate 26 are electrically connected to each other.

Although only the first vertical scanning circuit 10d is arranged on the third substrate 27 in FIG. 17, the present invention is not limited thereto. Any one or more of the column circuit unit 7, the column scanning circuit 8, and the signal processing unit 9 may be arranged on the third substrate 27. Because the first vertical scanning circuit 10d is arranged on the third substrate 27 and the column circuit unit 7, the column scanning circuit 8, and the signal processing unit 9 are arranged on the third substrate 27 in some cases, areas of the first substrate 20 and the second substrate 26 can be reduced.

A buffer arrangement shown in the other embodiments may be applied to a buffer arrangement in the area 11 immediately below the pixels of the second substrate 26. For example, buffers arranged in the area 11 immediately below the pixels may be only the first buffers 130a and 130b. Also, two buffers arranged in two rows adjacent to each other may be arranged so that the two buffers are displaced from each other in the row direction.

Although the first vertical scanning circuit 10d is arranged at a position overlapping the area 11 immediately below the pixels in FIG. 17, the first vertical scanning circuit 10d may be arranged at a position which does not overlap the area 11 immediately below the pixels. Also, although one vertical scanning circuit is arranged on the third substrate 27 in FIG. 17, two vertical scanning circuits may be arranged on the third substrate 27 and a transmission distance of the control signal may be shortened.

Although one pixel control signal line 12 is arranged for every row of the plurality of pixels 4 in FIG. 17, the present invention is not limited thereto. For example, one pixel control signal line 12 may be arranged for every two or more rows of the plurality of pixels 4.

Although one buffer is arranged for every row of the plurality of pixels 4 in FIG. 17, the present invention is not limited thereto. For example, one buffer may be arranged for every two or more rows of the plurality of pixels 4.

According to this embodiment, the image capturing device 1b includes: the first substrate 20; the second substrate 26; the third substrate 27; the pixel unit 3 having the plurality of pixels 4 arranged in a matrix shape on the first substrate 20; the first vertical scanning circuit 10d arranged on the third substrate 27 and configured to output a control signal supplied to every row or every two or more rows of the plurality of pixels 4; and the plurality of first buffers 130a arranged on the second substrate 26 so that the first buffers 130a overlap the pixel unit 3, provided in correspondence with one row or a plurality of rows of the plurality of pixels 4, and connected to signal lines (the pixel control signal lines 12) through which the control signal output from the first vertical scanning circuit 10d is transmitted, wherein the first substrate 20 and the second substrate 26 overlap each other and the third substrate 27 overlaps a surface opposite to a surface of the second substrate 26 facing the first substrate 20, or wherein the first substrate 20 and the third substrate 27 overlap each other and the second substrate 26 overlaps a surface opposite to a surface of the third substrate 27 facing the first substrate 20.

In this embodiment, because the first vertical scanning circuit 10d is arranged on the third substrate 27, the pixel control signal line 12 can be wired on the second substrate 26 without being affected by the arrangement of the first vertical scanning circuit 10d. Also, in this embodiment, because the first vertical scanning circuit 10d is arranged at a position corresponding to the center of the area 11 immediately below the pixels, a wiring length of the pixel control signal line 12 from the first vertical scanning circuit 10d to a most distant pixel 4 can be shortened. Thereby, the wiring capacitance, the wiring resistance, and the load are reduced, and the deviation in the supply timing of the control signal can be limited. Accordingly, a pixel 4 distant from the first vertical scanning circuit 10d can receive a control signal of a sharp waveform via the second buffer 132a and the second buffer 132b.

While embodiments of the present invention have been described above in detail with reference to the drawings, specific configurations are not limited to the above embodiments, and design changes and the like are also included without departing from the scope and spirit of the present invention. Furthermore, the present invention is not to be considered as being limited by the foregoing description, and is only limited by the appended claims.

What is claimed is:

1. An image capturing device comprising:
   a first substrate;
   a second substrate arranged so that the second substrate overlaps the first substrate;
   a pixel unit having a plurality of pixels arranged in a matrix shape on the first substrate;
   a first vertical scanning circuit arranged on one of the first substrate and the second substrate and configured to output a control signal supplied to every row or every two or more rows of the plurality of pixels;
   a plurality of pixel control signal lines arranged in correspondence with each row of the plurality of pixels on the second substrate, the plurality of pixel control signal lines being configured to unidirectionally transmit the control signal in a row direction, and the plurality of pixel control signal lines being branched at branch points such that branch lines are formed in a column direction corresponding to each column of the plurality of pixels for transmitting the control signal from the branch points to the plurality of pixels respectively; and
   a plurality of first buffers arranged along the plurality of pixel control signal lines respectively on the second substrate so that the plurality of first buffers overlap the pixel unit, each of the plurality of first buffers being arranged between two of the branch points along the same pixel control signal line, and the plurality of first buffers being provided in correspondence with one row or a plurality of rows of the plurality of pixels,
   wherein the control signal is directly transmitted to the pixels which receive the control signal from the branch points disposed nearer than the corresponding first buffer with respect to the first vertical scanning circuit without being transmitted via circuit of the first buffers, and
   wherein the control signal is transmitted to the circuit of the first buffers so as to be reshaped by the plurality of first buffers respectively, and the reshaped control signal is transmitted to the pixels which receive the reshaped control signal from the branch points disposed farther than the corresponding first buffer with respect to the first vertical scanning circuit.

2. The image capturing device according to claim 1, further comprising:
   a plurality of second buffers arranged on the second substrate, provided in correspondence with one row or a plurality of rows of the plurality of pixels, and connected to the pixel control signal lines to which the first buffers are connected.

3. The image capturing device according to claim 2, wherein the plurality of second buffers are arranged so that the plurality of second buffers overlap the pixel unit.

4. The image capturing device according to claim 1, further comprising:
a second vertical scanning circuit arranged on one of the first substrate and the second substrate and configured to output the control signal supplied to every row or every two or more rows of the plurality of pixels in synchronization with the first vertical scanning circuit, wherein
the plurality of pixels includes a first pixel and a second pixel arranged in the same row,
the control signal output from the first vertical scanning circuit is supplied to the first pixel, and
the control signal output from the second vertical scanning circuit is supplied to the second pixel.

5. The image capturing device according to claim 1, wherein the first vertical scanning circuit is arranged so that the first vertical scanning circuit at least partially overlaps the pixel unit.

6. The image capturing device according to claim 1, wherein two first buffers arranged in two rows adjacent to each other among the plurality of first buffers are arranged so that the two first buffers are displaced from each other in a row direction.

7. An image capturing device comprising:
a first substrate;
a second substrate;
a third substrate;
a pixel unit having a plurality of pixels arranged in a matrix shape on the first substrate;
a first vertical scanning circuit arranged on the third substrate and configured to output a control signal supplied to every row or every two or more rows of the plurality of pixels;
a plurality of pixel control signal lines arranged in correspondence with each row of the plurality of pixels on the second substrate, the plurality of pixel control signal lines being configured to unidirectionally transmit the control signal in a row direction, and the plurality of pixel control signal lines being branched at branch points such that branch lines are formed in a column direction corresponding to each column of the plurality of pixels for transmitting the control signal from the branch points to the plurality of pixels respectively; and
a plurality of first buffers arranged along the plurality of pixel control signal lines respectively on the second substrate so that the plurality of first buffers overlap the pixel unit, each of the plurality of first buffers being arranged between two of the branch points along the same pixel control signal line, and the plurality of first buffers being provided in correspondence with one row or a plurality of rows of the plurality of pixels,
wherein the control signal is directly transmitted to the pixels which receive the control signal from the branch points disposed nearer than the corresponding first buffer with respect to the first vertical scanning circuit without being transmitted via circuit of the first buffers,
wherein the control signal is transmitted to the circuit of the first buffers so as to be reshaped by the plurality of first buffers respectively, and the reshaped control signal is transmitted to the pixels which receive the reshaped control signal from the branch points disposed farther than the corresponding first buffer with respect to the first vertical scanning circuit, and
wherein the first substrate and the second substrate overlap each other and the third substrate overlaps a surface opposite to a surface of the second substrate facing the first substrate, or the first substrate and the third substrate overlap each other and the second substrate overlaps a surface opposite to a surface of the third substrate facing the first substrate.

* * * * *